US010121967B2

(12) United States Patent
Paz de Araujo et al.

(10) Patent No.: US 10,121,967 B2
(45) Date of Patent: *Nov. 6, 2018

(54) CEM SWITCHING DEVICE

(71) Applicant: ARM Limited, Cambridge (GB)

(72) Inventors: Carlos Alberto Paz de Araujo, Colorado Springs, CO (US); Jolanta Bozena Celinska, Colorado Springs, CO (US); Kimberly Gay Reid, Austin, TX (US); Lucian Shifren, San Jose, CA (US)

(73) Assignee: Arm Limited, Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/363,216

(22) Filed: Nov. 29, 2016

(65) Prior Publication Data

US 2018/0151800 A1     May 31, 2018

(51) Int. Cl.
| H01L 45/00 | (2006.01) |
| C23C 14/00 | (2006.01) |
| C23C 14/16 | (2006.01) |
| C23C 16/455 | (2006.01) |
| C23C 16/50 | (2006.01) |

(52) U.S. Cl.
CPC ........ *H01L 45/146* (2013.01); *C23C 14/0036* (2013.01); *C23C 14/165* (2013.01); *C23C 16/45525* (2013.01); *C23C 16/50* (2013.01); *H01L 45/04* (2013.01); *H01L 45/1233* (2013.01); *H01L 45/1253* (2013.01); *H01L 45/1608* (2013.01)

(58) Field of Classification Search
CPC .......................... H01L 45/146; H01L 45/1608
See application file for complete search history.

(56) References Cited

U.S. PATENT DOCUMENTS

| 9,589,636 | B1 * | 3/2017 | Bhavnagarwala | ............................ G11C 13/0002 |
| 9,627,615 | B1 * | 4/2017 | Reid | ................... H01L 45/1253 |
| 9,660,189 | B1 * | 5/2017 | Reid | ..................... H01L 45/085 |
| 9,735,360 | B2 * | 8/2017 | Shifren | ................. H01L 49/003 |
| 9,773,550 | B2 * | 9/2017 | Bhavnagarwala | ............................ G11C 13/0069 |
| 2008/0106925 | A1 * | 5/2008 | Paz de Araujo | ........ H01L 45/04 365/148 |
| 2008/0106926 | A1 * | 5/2008 | Brubaker | ............ H01L 27/2409 365/148 |
| 2008/0106927 | A1 * | 5/2008 | Celinska | ................. H01L 45/04 365/148 |

(Continued)

FOREIGN PATENT DOCUMENTS

WO    WO2009140305    11/2009

OTHER PUBLICATIONS

A. Sawa, Resistive switching in transition metal oxides, Jun. 2008, MaterialsToday, vol. 11, No. 6, pp. 28-36, all pages.*

*Primary Examiner* — Victoria K Hall
(74) *Attorney, Agent, or Firm* — Leveque IP Law, P.C.

(57) ABSTRACT

Subject matter herein disclosed relates to an improved CEM switching device and methods for its manufacture. In this device, a conductive substrate and/or conductive overlay comprises a primary layer of a conductive material and a secondary layer of a conductive material. The primary layer contacting the CEM layer is substantially inert to the CEM layer and/or acts as an oxygen barrier for the secondary layer at temperatures used for the manufacture of the device.

14 Claims, 5 Drawing Sheets

(56) References Cited

U.S. PATENT DOCUMENTS

| | | | |
|---|---|---|---|
| 2008/0107801 A1* | 5/2008 | Celinska | H01L 45/04 |
| | | | 427/96.7 |
| 2009/0104756 A1 | 4/2009 | Kumar | |
| 2010/0019219 A1 | 1/2010 | Lee | |
| 2010/0207093 A1 | 8/2010 | Inoue et al. | |
| 2010/0237317 A1* | 9/2010 | Tsunoda | G11C 13/0007 |
| | | | 257/4 |
| 2012/0113706 A1 | 5/2012 | Stanley et al. | |
| 2013/0248801 A1 | 9/2013 | Yamamoto | |
| 2014/0113428 A1 | 4/2014 | Lin et al. | |
| 2014/0231743 A1 | 8/2014 | Ramaswamy et al. | |
| 2014/0301127 A1 | 10/2014 | Kim et al. | |
| 2015/0129816 A1 | 5/2015 | Wang | |
| 2015/0188048 A1 | 7/2015 | Wang | |
| 2017/0092858 A1* | 3/2017 | Shifren | H01L 49/003 |
| 2017/0117043 A1* | 4/2017 | Sandhu | G11C 13/0069 |
| 2017/0147207 A1* | 5/2017 | Hansson | G06F 3/061 |

* cited by examiner

CEM SWITCHING DEVICE

FIELD OF THE DISCLOSURE

The present disclosure relates to a switching device comprising a correlated electron material (CEM) layer and to methods for the manufacture of the device.

BACKGROUND

Electronic switching devices are found in a wide variety of electronic device types, such as computers, digital cameras, cellular telephones, tablet devices, personal digital assistants and so forth, where they may function as memory and/or logic devices.

Factors of interest to a designer in considering whether a particular electronic switching device is suitable for such a function, may include physical size, storage density, operating voltages, impedance ranges, and/or power consumption. Other factors of interest may include cost of manufacture, ease of manufacture, scalability and/or reliability.

DETAILED DESCRIPTION

There appears to be an ever-increasing drive towards memory and/or logic devices exhibiting lower power and/or higher speed. Switching devices comprising a CEM are at the forefront of this drive not just because they can exhibit low power and/or high speed but also because they are generally reliable and easily and cheaply manufactured.

The present disclosure describes an improved CEM switching device and methods for its manufacture. The CEM switching device may, for example, find application as a correlated electron random access memory (CERAM) in memory and/or logic devices which may be used with a wide range of electronic circuit types, such as memory controllers, memory arrays, filter circuits, data converters, optical instruments, phase locked loop circuits, microwave and millimeter wave transceivers, and so forth.

A CEM switching device can exhibit a rapid conductor-to-insulator transition as compared to other switching devices because the switching is brought about by an electron correlation rather than by a solid state structural phase change or by formation of filaments, as is found respectively in phase change memory devices and resistive RAM devices.

The rapid conductor-to-insulator transition of a CEM switching device may, in particular, be responsive to a quantum mechanical phenomenon in contrast to the melting/solidification or filament formation found respectively in phase change and resistive RAM devices. The quantum mechanical transition in a CEM switching device between a relatively conductive state and a relatively insulative state (or between a first impedance state and a second impedance state) may occur in several ways.

In one respect, a quantum mechanical transition of a CEM between a relatively insulative/higher impedance state and a relatively conductive/lower impedance state may be understood in terms of a Mott transition. In accordance with a Mott transition, a material may switch from a relatively insulative/higher impedance state to a relatively conductive/lower impedance state if a Mott transition condition is satisfied. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state).

In another respect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

The switching from a relatively insulative/higher impedance state to a relatively conductive/lower impedance state may bring about a change in capacitance in addition to a change in resistance. For example, a CEM switch may exhibit a variable resistance together with a property of variable capacitance. In other words, impedance characteristics of a CEM switch may include both resistive and capacitive components. For example, in a metal state, a CEM switch may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a relatively conductive/lower impedance state in a CEM switch may result in changes in both resistance and capacitance.

A switching device formed from a CEM may exhibit switching of impedance states responsive to a Mott-transition in a majority of the volume of the CEM comprising the device. The CEM may, in particular, form a "bulk switch". As used herein, the term "bulk switch" refers to at least a majority volume of a CEM switching a device's impedance state, such as in response to a Mott-transition. For example, substantially all CEM of a device may switch from a relatively insulative/higher impedance state to a relatively conductive/lower impedance state or from a relatively conductive/lower impedance state to a relatively insulative/higher impedance state responsive to a Mott-transition.

In one arrangement, shown in FIG. 1B, a CEM switching device may comprise a CEM layer sandwiched between a conductive substrate and a conductive overlay. In this arrangement, the CEM switching device can act as memory storage element. In other arrangements, the CEM switching device may comprise either a CEM layer provided on a conductive substrate or a CEM layer provided with a conductive overlay. In these other arrangements, the device comprises source and drain regions providing for a flow of current across the device.

Referring now to FIG. 1A, a current density versus voltage profile 100 of a CEM switching device is shown which illustrates its switching behaviour. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM switching device to a relatively low-impedance memory state. Conversely, application of a voltage $V_{reset}$ and a current density $J_{reset}$ may bring about a transition of the CEM device to a relatively high-impedance memory state.

As shown in FIG. 1A, reference designator 110 illustrates the voltage range that may separate $V_{set}$ from $V_{reset}$. Following placement of the CEM switching device into a high-impedance state or a low-impedance state, the particular state of the CEM switching device may be detected by application of a voltage $V_{read}$ (e.g., during a read operation) and detection of a current or current density at terminals of the CEM switching device (e.g., utilizing read window 107).

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM switching device may switch from a relatively low-impedance state to a relatively high-impedance state, for example, responsive to a Mott transition. This may correspond to point 108 of the voltage versus current density profile of FIG. 1A. At, or suitably nearby this point, electrons are no longer screened and become localized near the metal ion. This correlation may result in a strong electron-to-electron interaction potential which may operate to split the bands to form a relatively high-impedance material.

If the CEM switching device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain devices, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

The current in a CEM switching device may be controlled by an externally applied "compliance" condition, which may be determined at least partially on the basis of an applied external current, which may be limited during a write operation, for example, to place the CEM device into a relatively high-impedance state. This externally-applied compliance current may, in some devices, also set a condition of a current density for a subsequent reset operation to place the CEM device into a relatively high-impedance state. As shown in the particular device of FIG. 1A, a current density $J_{comp}$ may be applied during a write operation at point 116 to place the CEM switching device into a relatively high-impedance state, may determine a compliance condition for placing the CEM device into a low-impedance state in a subsequent write operation. As shown in FIG. 1A, the CEM device may be subsequently placed into a low-impedance state by application of a current density $J_{reset} \geq J_{comp}$ at a voltage $V_{reset}$ at point 108, at which $J_{comp}$ is externally applied.

The compliance may, in particular, set a number of electrons in a CEM switching device which may be "captured" by holes for the Mott transition. In other words, a current applied in a write operation to place a CEM device into a relatively low-impedance memory state may determine a number of holes to be injected to the CEM device for subsequently transitioning the CEM switching device to a relatively high-impedance memory state.

As pointed out above, a reset condition may occur in response to a Mott transition at point 108. Such a Mott transition may bring about a condition in the CEM switching device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \tag{1}$$

$$n = \left(\frac{C}{\lambda_{TF}}\right)^3$$

wherein $\lambda_{TF}$ corresponds to a Thomas Fermi screening length, and C is a constant.

A current or current density in region 104 of the voltage versus current density profile shown in FIG. 1A, may exist in response to injection of holes from a voltage signal applied across terminals of the CEM switching device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \tag{2}$$

$$Q(V_{MI}) = qn(V_{MI})$$

wherein $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \tag{3}$$

$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

wherein $A_{CEM}$ is a cross-sectional area of a CEM switching device; and $J_{reset}(V_{MI})$ may represent a current density through the CEM switching device to be applied to the CEM switching device at a threshold voltage $V_{MI}$, which may place the CEM switching device into a relatively high-impedance state.

FIG. 1B shows a CEM switching device 150 comprising a CEM layer 160 sandwiched between a conductive substrate 170 and a conductive overlay 180 and a schematic diagram of an equivalent circuit for the switching device.

As previously mentioned, the CEM switching device may exhibit characteristics of both variable resistance and variable capacitance. In other words, the CEM switching device may be considered as a variable impedance device in which the impedance depends at least in part on resistance and capacitance characteristics of the device if measured across device terminals 190 and 190'. The equivalent circuit for a variable impedance device may comprise a variable resistor 192, such as variable resistor, in parallel with a variable capacitor 194. Of course, although a variable resistor and variable capacitor are depicted in FIG. 1B as comprising discrete components, the variable impedance device, such as that shown, may comprise a substantially homogenous CEM.

Table 1 below depicts an example truth table for an example variable impedance device, such as the device of FIG. 1A.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

Table 1 shows that a resistance of a variable impedance device, such as that shown, may transition between a low-impedance state and a substantially dissimilar, high-impedance state as a function at least partially dependent on a voltage applied across the CEM switching device. The impedance exhibited at a low-impedance state may, for example, be approximately in the range of 10.0-100,000.0 times lower than an impedance exhibited in a high-impedance state. However, the impedance exhibited at a low-impedance state may be approximately in the range of 5.0 to 10.0 times lower than an impedance exhibited in a high-impedance state. Table 1 also shows that a capacitance of a variable impedance device, such as the device shown, may transition between a lower capacitance state, which may, for example comprise an approximately zero, or very little, capacitance, and a higher capacitance state that is a function, at least in part, of a voltage applied across the CEM switching device.

The CEM switching device may be placed into a relatively low-impedance memory state, such as by transitioning from a relatively high impedance state, for example, via injection of a sufficient quantity of electrons to satisfy a Mott transition criteria. In transitioning a CEM switching device to a relatively low-impedance state, if enough electrons are injected and the potential across the terminals of the CEM device overcomes a threshold switching potential (e.g., $V_{set}$), injected electrons may begin to screen. As previously mentioned, screening may operate to delocalize double-occupied electrons to collapse the band-splitting potential, thereby bringing about a relatively low-impedance state.

The CEM switching device may comprise a CEM layer comprising one or more of a metal compound, such as a transition metal oxide (TMO). Further, the conductive substrate and/or the conductive overlay may comprise one or more of a transition metal or a transition metal compound, such as a transition metal nitride or a semiconductor or an alloy.

On occasion, therefore, an oxidation layer may form over the conductive substrate during the formation of the conductive substrate and/or during subsequent processing. For example, if the CEM layer, deposited over the conductive substrate, utilizes a TMO, such as NiO, oxygen atoms from CEM layer may migrate or diffuse towards the conductive substrate. At times, such oxygen migration may give rise to an interfacial layer, such as oxidation layer, which may introduce a resistance to an electric current flowing between the CEM layer and the conductive substrate.

Likewise, in at least some instances, after formation of the conductive overlay, an oxygen migration or diffusion from the CEM layer may bring about formation of an interfacial layer, such as an oxidation layer, which may introduce a resistance to an electric current flowing between the CEM layer and the conductive overlay.

U.S. patent application Ser. No. 15/207,708 (incorporated herein by reference) discloses one approach to the problem of formation of such interfacial layers. This approach involves exposing the conductive substrate and/or conductive overlay to an agent which inhibits the formation of an oxide layer, for example, at the interfacial surface of the substrate.

The present disclosure describes an alternative approach to the problem of formation of such interfacial layers. This approach is based on forming the conductive substrate and/or conductive overlay as a layered structure wherein a layer which contacts the CEM layer comprises a conductive material which is substantially resistant to diffusion or migration of oxygen ion therein at temperatures which are used during the formation of the CEM switching device and its integration to a circuit board.

Accordingly, in a first aspect, the method comprises forming a conductive substrate and forming a layer of a correlated electron material (CEM) on the conductive substrate, wherein the forming of the conductive substrate comprises forming a primary layer of a conductive material and forming a secondary layer of a conductive material such that the primary layer contacts the CEM layer and wherein the forming of the conductive material of the primary layer is substantially resistant to diffusion or migration of oxygen ion from the CEM layer to the secondary layer.

In a second aspect, the present disclosure provides a method for the manufacture of a CEM switching device, which method comprises forming a layer of a correlated electron material (CEM) on a substrate and forming a conductive overlay on the CEM layer, wherein the forming of the conductive overlay comprises forming a primary layer of a conductive material contacting the CEM layer and forming a secondary layer of a conductive material on or over the primary layer and wherein the conductive material of the primary layer is substantially resistant to diffusion or migration of oxygen ion from the CEM layer to the secondary layer.

In a third aspect, the present disclosure provides a method for the manufacture of a CEM switching device, which method comprises forming a conductive substrate, forming a layer of a correlated electron material (CEM) on the conductive substrate and forming a conductive overlay on the CEM layer, wherein the forming of the conductive substrate and/or the conductive overlay comprises forming a primary layer of a conductive material contacting the CEM layer and forming a secondary layer of a conductive material on or over the primary layer and wherein the conductive material of the primary layer is substantially resistant to diffusion or migration of oxygen ion from the CEM layer to the secondary layer.

Note that the forming of the primary layer of the conductive substrate will normally be on or over the secondary layer and the forming of the primary layer of the conductive overlay will be on the CEM layer.

The primary layer of the conductive overlay should, in particular, be resistant to diffusion or migration of oxygen ion from the CEM layer during the forming of its secondary layer.

The primary layer of the conductive substrate should, in particular, be resistant to diffusion or migration of oxygen ion during the forming of the CEM layer. In embodiments, requiring a conductive overlay, the primary layer of the conductive substrate should also be resistant to diffusion or migration of oxygen ion during the forming of the conductive overlay.

Note that in embodiments requiring both conductive substrate and conductive overlay but that only one of them comprises a primary layer and a secondary layer, the other may simply comprise a layer of a conductive material which is also resistant to diffusion or migration of oxygen ion.

Note further that the primary layer of the conductive overlay may comprise a different conductive material as compared to the primary layer of the conductive substrate.

Notwithstanding the differences between the foregoing aspects and embodiments, the forming of the primary layers may utilise substantially the same method. Accordingly, except where context suggests otherwise, references to forming the primary layer may be interpreted as relating to the conductive substrate and/or the conductive overlay in any aspect or embodiment.

The forming of the CEM layer may utilise temperatures within the range 20° C. and 1000° C. It may, for example, comprise depositing the conductive material at a selected temperature within that range and, optionally, annealing at another selected temperature within that range.

Likewise, the forming of the conductive substrate and the conductive overlay may utilise temperatures within the range 20° C. and 1000° C. The forming of a primary layer and the forming of the secondary layer may, for example, be carried at different temperatures within that range.

The conductive material of the primary layer may, therefore, be resistant to diffusion or migration of oxygen at temperatures between 20° C. and 1000° C. However, it may only be so resistant at temperatures between 20° C. and 750° C.—when the temperatures used for forming the CEM layer and the conductive overlay do not exceed 750° C. Likewise, it may only be so resistant at temperatures between 20° C. and 450° C.

The conductive material of the secondary layer is different from that of the primary layer. It need not be resistant to oxidation at temperatures above 100° C. and may, in particular, form an oxide have a relatively high impedance as compared to the CEM layer. It may be chosen for its etching properties as compared to those of the conductive material of the primary layer.

In some embodiments, the conductive material of the primary layer may be resistant to oxidation at temperatures between 20° C. and 1000° C. Alternatively, the conductive material of the primary layer may be so resistant at temperatures between 20° C. and 750° C. or between 20° C. and 450° C.

In other embodiments, however, the conductive material of the primary layer may be susceptible to oxidation—provided that the primary layer remains relatively conductive as compared to the CEM layer.

Suitable conductive materials for the primary layer include noble metals and alloys thereof. The method may, therefore, comprise forming a primary layer comprising one or more of ruthenium, rhodium, palladium, silver, osmium, iridium, platinum, gold, copper and rhenium.

Other suitable conductive materials for the primary layer include noble metal oxides and mixtures thereof. The method may, therefore, comprise forming a primary layer comprising one or more of a noble metal oxide such as ruthenium oxide ($RuO_x$), iridium oxide ($IrO_x$), rhodium oxide ($RhO_x$) and platinum oxide ($PtO_x$).

Still other suitable conductive materials for the primary layer include mixtures of a noble metal and a noble metal oxide such as iridium ruthenium oxide (Ir—$RuO_x$). Accordingly, the method may comprise forming a primary layer comprising one or more of iridium ruthenium oxide (Ir—$RuO_x$), ruthenium iridium oxide (Ru—$IrO_x$), ruthenium platinum oxide (Ru—$PtO_x$), platinum ruthenium oxide (Pt—$RuO_x$), platinum rhodium oxide (Pt—$RhO_x$) and the like.

Although transition metal nitrides such as titanium nitride are susceptible to oxidation at temperatures below 1000° C., conductive materials such as ruthenium titanium nitride (Ru—TiN) can remain relatively conductive even after exposure to an oxidising environment at relatively high temperatures (for example, greater than 200° C.)

Accordingly, the method may comprise forming a primary layer comprising one or more of ruthenium titanium nitride (Ru—TiN), platinum titanium nitride (Pt—TiN), iridium titanium nitride (Ir—TiN), palladium titanium nitride (Pd—TiN), rhodium titanium nitride (Rh—TiN), ruthenium tantalum nitride (Ru—TaN), rhodium tantalum nitride (Rh—TaN), platinum tantalum nitride (Pt—TaN), iridium tantalum nitride (Ir—TaN) and palladium tantalum nitride (Pd—TaN) and the like.

Other suitable conductive materials for the primary layer may similarly comprise a noble metal and a transition metal silicide such as nickel silicide which are relatively conductive even after exposure to an oxidising environment at relatively high temperatures.

Accordingly, the method may comprise forming a primary layer comprising one or more of ruthenium nickel silicide (Ru—NiSi), platinum nickel silicide (Pt—NiSi), rhodium nickel silicide (Rh—NiSi), iridium nickel silicide (Ir—NiSi) and palladium nickel silicide (Pd—NiSi).

Still other suitable conductive materials for the primary layer comprise alloys of a noble metal and a transition metal, such as copper, cobalt, aluminium, nickel or a noble metal and polycrystalline silicon which are relatively conductive even after exposure to an oxidising environment at relatively high temperatures.

Accordingly, the method may comprise forming a primary layer comprising an alloy such as Ru—Al, Ru—Cu, Ru—Co or Ru—Ni, or Ru-polysilicon, Pt-polysilicon or Ir-polysilicon.

Still other suitable conductive materials for the primary layer include noble metal silicides, such as ruthenium silicide ($Ru_2Si_3$), which are relatively conductive even after exposure to an oxidising environment at 700° C.

Accordingly, the method may comprise forming a primary layer comprising ruthenium silicide ($Ru_2Si_3$), platinum silicide (PtSi), iridium silicide (IrSi) and the like.

The method may utilise a physical vapour deposition or a chemical vapour deposition to form the primary layer. The method may, for example, comprise forming the primary layer by one or more of atomic layer deposition (which may be a laser- or plasma-enhanced), a chemical vapour deposition (which may be a laser- or plasma-enhanced), rapid thermal or hot wire chemical vapour deposition, electron or ion beam chemical vapour deposition, sputtering, ion beam sputtering, reactive sputtering, ion plating.

In one embodiment, the forming of the primary layer comprises sputtering one or more noble metals in an inert atmosphere at a temperature between 20° C. and 1000° C. The sputtering may, in particular, form a primary layer comprising any one of the noble metals mentioned above.

Alternatively, it may form a primary layer comprising an alloy of two or more noble metals such as a ruthenium-iridium alloy.

In another embodiment, the forming of the primary layer comprises sputtering one or more noble metals, such as ruthenium, platinum or iridium—followed by oxidation in an atmosphere comprising an oxidant, such as oxygen, at a temperature within 20° C. and 1000° C.

In still another embodiment, the forming of the primary layer comprises sputtering one or more noble metals, such as ruthenium, platinum or iridium, in an atmosphere comprising an oxidant, such as oxygen, at a temperature within 20° C. and 1000° C.

In these latter embodiments, the primary layer comprises one or more of a conductive metal oxide, such as ruthenium oxide ($RuO_x$), iridium oxide ($IrO_x$), platinum oxide ($PtO_x$) and mixtures thereof.

In another embodiment, the forming of the primary layer comprises sputtering of silicon and one or more of a noble metal at a temperature between 20° C. and 1000° C. The sputtering may be followed by annealing in an inert atmosphere at a temperature within 20° C. and 1000° C.

In still another embodiment, the forming of the primary layer comprises an atomic layer deposition or metallo-organic chemical vapour deposition (which may be laser- or plasma-enhanced) of a noble metal or noble metal oxide from an organometallic precursor molecule.

Such depositions are described throughout the academic literature and the atomic layer depositions are reviewed by Hämäläinen J. et al., in "Atomic Layer Deposition of Noble Metals and Their Oxides", Chem. Mater. 2014, 26, 786-801.

In one embodiment, the forming of the primary layer comprises an atomic layer deposition based upon oxidation of an organometallic precursor by oxygen or air. The deposition, which may be carried out at a temperature above 200° C. can be represented by the following expression (4):

$$AX_{(gas)} + O_2 \text{ or air} = A_{(metal)} + \text{combustion products} \quad (4)$$

wherein AX is the organometallic precursor, the metal (A) is most suitably ruthenium, osmium, rhodium, iridium or platinum and "combustion products" are gases such as carbon monoxide, carbon dioxide, methane, hydrogen and water which may be considered to arise from combustion of the organometallic precursor.

In expression (4), the "X" of the organometallic precursor represents one or more organic ligand, such as cyclopentadienyl (Cp), ethylcyclopentadienyl (EtCp), methylcyclopentadienyl (MeCp), dime thylaminocyclopentadienyl ($Me_2NEtCp$), 2,4-dimethylpentadienyl (dmpd), cyclohexadienyl (chd), methyl dimethyl cyclohexadienyl ($Me-Me_e$-chd), cyclooctadienyl (cod), methyl (Me), ethyl (Et), carbonyl (CO), triphenylphosphine ($PPh_3$), tri-n-butylphosphine ($P^nBu_3$), pyridyl (Py), methylpyridyl (MePy), dimethylpyridyl ($Me_2Py$), 1,4-isopropyl(methyl)benzene (iPr-Me-Be), ethylbenzene (Et-Be), pivalate (piv), acetylacetonato (acac), 2,2,6,6-tetramethylheptane-3,5-dionato (thd), octane-2-4-dianato (od), 1,3 di-t-butylacetamidinato (tBu-Me-amd), hexafluoracetylacetonato (hfd), 6,6,7,7,8,8,8-heptafluoro-2,2-dimethyl-3,5-octanedionato (hfac) and the fluorinated β-ketoiminates known as keim1, keim2 and keim3.

The forming of the primary layer may, in particular, comprise an atomic layer deposition based upon oxidation of one or more of tris(acetylacetonato)rhodium ($Rh(acac)_3$), tris(acetyl-acetonato)iridium ($Ir(acac)_3$), tris(acetylacetonato)platinum ($Pt(acac)_3$), dimethyl(acetylacetonato)gold (($acac$)$AuMe_2$), bis(cyclopentadienyl)ruthenium ($Ru(Cp)_2$), bis(cyclopentadienyl)osmium ($Os(Cp)_2$) and triethylphosphine(6,6,7,7,8,8,8-hepta-fluoro-2,2-dimethyl-3,5-octanedionato)silver (($hfac$)$AgPEt_3$) by oxygen or air.

Note that oxidation of such organometallic precursors by oxygen or air generally leads to deposition of the noble metal—but that, at least for ruthenium and iridium, a careful selection of organometallic precursor and process conditions such as temperature, concentration of the organometallic precursor and partial pressure of oxygen may enable the formation of the noble metal oxide.

An atomic layer deposition of a noble metal oxide is, however, more generally carried out by oxidation of such organometallic precursors with ozone.

In another embodiment, therefore, the forming of the primary layer comprises an atomic layer deposition based on oxidation of an organometallic precursor by ozone. The deposition, which may be carried out at a temperature below 200° C., may be represented by the following expression (5):

$$AX_{(gas)} + O_3 = A_xO_{y(solid)} + \text{combustion products} \quad (5)$$

wherein AX is the organometallic precursor, $A_xO_y$ is most suitably an oxide of rhodium, iridium, palladium or platinum and "combustion products" are gases such as carbon monoxide, carbon dioxide, methane, hydrogen and water which may be considered to arise from combustion of the organometallic precursor.

In expression (5), the of the organometallic precursor represents one or more organic ligand, such as cyclopentadienyl (Cp), ethylcyclopentadienyl (EtCp), methylcyclopentadienyl (MeCp), dime thylaminocyclopentadienyl ($Me_2NEtCp$), 2,4-dimethylpentadienyl (dmpd), cyclohexadienyl (chd), methyl dimethyl cyclohexadienyl ($Me-Me_e$-chd), ethyl (Et), carbonyl (CO), pyridyl (Py), methylpyridyl (MePy), dimethylpyridyl ($Me_2Py$), 1,4-isopropyl(methyl)benzene (iPr-Me-Be), ethylbenzene(Et-Be), acetylacetonato (acac), 2,2,6,6-tetramethylheptane-3,5-dionato (thd), octane-2,4-dianato (od) and 1,3 di-t-butylacetamidinato (tBu-Me-amd).

The forming of the primary layer may, in particular, comprise an atomic layer deposition based upon oxidation of organometallic precursors such as tris(acetylacetonato)iridium, tris(acetylacetonato)rhodium and bis(cyclopentadienyl)ruthenium by ozone.

In still another embodiment, the forming of the primary layer comprises an atomic layer deposition based upon the formation and reduction of a noble metal oxide. The deposition, which may be carried out at a temperature below 200° C., may be represented by the following expression(6):

$$AX_{(gas)} + O_3/H_2 = A_{(metal)} + \text{combustion products} \quad (6)$$

wherein "AX" is the organometallic precursor, the metal (A) is most suitably rhodium, iridium, palladium or platinum and "combustion products" are gases such as carbon monoxide, carbon dioxide, methane, hydrogen and water which may be considered to arise from combustion of the organometallic precursor.

Note that in this embodiment, the deposition may employ a unit cycle comprising (1) pulsing with ozone and (2) pulsing with hydrogen. The pulsing with ozone leads to an intermediate oxide which is reduced to the metal by the pulsing with hydrogen.

In expression (6), the "X" of the organometallic precursor represents one or more organic ligand, such as those mentioned in relation to expression (5) above.

The forming of the primary layer may, in particular, comprise an atomic layer deposition based on oxidation-reduction of tris(acetylacetonato)rhodium ($Rh(acac)_3$) or tris(acetylacetonato)-iridium (Ir(acac)$_3$) by sequential pulsing with ozone and hydrogen.

In still another embodiment, the forming of the primary layer comprises an atomic layer deposition based upon a direct reduction of the organometallic precursor by hydrogen or other reducing agent. This deposition, which may be carried out at a temperature between 100° C. and 500° C., may be represented by the expression (7):

$$AX_{(gas)} + [R] = A_{(metal)} + \text{gas products} \tag{7}$$

wherein "AX" is the organometallic precursor, the metal (A) is most suitably ruthenium, rhodium, iridium, platinum or palladium and [R] is a reducing agent such as hydrogen or formalin.

In expression (7), the of the organometallic represents one or more organic ligands such as those mentioned in relation to expressions (4) or (5) above.

The forming of the primary layer may, therefore, comprise an atomic layer deposition based on reduction of bis(6,6,7,7,8,8,8-heptafluoro-2,2-dimethyl-3,5-octanedionato)palladium (Pd(hfac)$_2$) by formalin.

In one embodiment, the forming of the primary layer comprises an atomic layer deposition providing for the formation of sub-layers of noble metal and a transition metal nitride, such as titanium nitride, tantalum nitride or tungsten nitride.

The deposition may be carried out at a temperature between 100° C. and 500° C. Of course, where the transition metal nitride is susceptible to oxidation by ozone, oxygen or air at that temperature, the deposition should provide that the noble metal is deposited by direct reduction of its organometallic precursor.

In a particular embodiment, the forming of the primary layer may comprise forming one or more sub-layers comprising ruthenium by direct reduction of an organometallic precursor containing ruthenium by hydrogen as described above.

It may further comprise forming one or more sub-layers comprising titanium nitride by reaction of an organometallic precursor containing titanium with nitrogen in accordance with the following expression (8):

$$AX_{(gas)} + N_2 \text{ or } NH_3 = AB_{(solid)} + XY_{(gas)} \tag{8}$$

wherein "A" corresponds to titanium, "AB" corresponds to titanium nitride.

In expression (8), "X" may comprise one or more of an organic ligand such as dimethylamido (Me$_2$N—), diethylamido (Et$_2$N—), tert-butylimido (tBuN=), carbonyl (—CO), ethoxy (—OEt), isopropoxyl (—O$^1$Pr), 1- or 2-methylbutylisonitrilo (MeBuNC—) and cyclopentadienyl (Cp). Alternatively "X" may comprise one or more of a ligand such as halogen and, in particular, fluoro (—F), chloro (—Cl) or bromo (—Br) as well as a β-diketone or an amidinate such as N,N'-di-sec-butylacetamidinate or N,N'-diallylacetamidinate.

The forming of the primary layer may, in particular, comprise an atomic layer deposition of bis(ethylcyclo-pentadienyl)ruthenium (Ru(EtCp)$_2$) and tetrakis(dimethylamino)titanium (TDMAT) in sub-cycles allocated to ruthenium and titanium nitride respectively. An atomic layer deposition based on these precursors is described by Jeong, S-J et al., in Journal of Nanoscience and Nanotechnology, 2011, 11, 671-674.

In one embodiment, the forming of the primary layer comprises an atomic layer deposition utilizing separate precursor molecules providing for the formation of sub-layers of silicon and noble metal in accordance with the following expression (9):

$$AX_{(gas)} + BY_{(gas)} + [R] = AB_{(solid)} + XY_{(gas)} \tag{9}$$

wherein "A" is most suitably ruthenium, rhodium, iridium, platinum or palladium, AB corresponds to a noble metal silicide, such as ruthenium silicide (Ru$_2$Si$_3$) and [R] is a reducing agent, such as ammonia.

In this embodiment, "X" of expression (9) may comprise one or more organic ligands, such as those mentioned in relation to expression (4) or (5) above.

Accordingly, a ruthenium-based precursor AX may comprise, for example, bis(cyclopentadienyl)ruthenium (Ru(Cp)$_2$, bis(ethylcyclo-pentadienyl)ruthenium (Ru (EtCp)$_2$ or bis(2,4-dimethylpenta-dienyl)ruthenium (Ru (dmpd)$_2$).

In expression (9), the precursor "BY" may comprise a silicon halide, such as silicon tetrafluoride (SiF$_4$) or silicon tetrachloride (SiCl$_4$) or a silicon-donating organic molecule such as an alkylsilane, for example, triethylsilane, a silicon alkoxide, such as tetraethyl orthosilicate (TEOS), a siloxane, a silazane or a silicon alkyl amide such as silicon tetrakis (ethylmethyl)amide.

In this embodiment, the forming of the primary layer may be followed by annealing.

Note that the forming of the primary layer may comprise a unit cycle comprising pulsing (1) the "AX" or "BY" precursor (2) ammonia (3) the "BY" or "AX" precursor and (4) ammonia. Such a cycle deposits alternative sub-layers of silicon and noble metal. Annealing those sub-layers can lead to the formation of the noble metal silicide by diffusion of one or other or both of silicon and noble metal.

The annealing may be carried out in situ and may, in particular, comprise a rapid thermal annealing to a temperature or temperatures between 20° C. and 1000° C.

Note that a reference to a sub-layer herein is a reference to a layer formed by a sub-cycle of a predetermined number of unit cycles forming a particular chemical entity, such as ruthenium, or titanium nitride.

Note further that a conductive material formed by an atomic layer deposition of different sub-layers is generally indicated herein by the symbol "-", notwithstanding that the material might be regarded, and sometimes described, as a single chemical entity.

Thus, the conductive material formed by atomic layer deposition providing sub-layers of ruthenium and titanium nitride described above is indicated as (Ru—TiN).

In another embodiment, the forming of the conductive material of the primary layer comprises an atomic layer deposition providing a monolayer comprising more than one noble metal or more than one noble metal oxide.

Note that, as used herein, "a monolayer" refers to a layer which is formed by a single unit cycle of an atomic layer deposition providing a particular chemical entity. Such a monolayer does not arise from distinct and parallel unit cycles but rather requires that the organometallic precursors react with another reactant in a single unit cycle to form a mixture of similar chemical entities, such as noble metals or noble metal oxides.

A monolayer comprising more than one noble metal or more than one noble metal oxide can arise through simultaneous pulsing of different organometallic precursors. It may also arise through sequential pulsing of different organometallic precursors wherein the concentration of precursors or the duration of pulsing is such that a partial coverage is achieved using one precursor and completed using another precursor.

Note that a conductive material formed by atomic layer deposition of monolayers comprising, for example, ruthenium and iridium is generally indicated herein by the symbol notwithstanding that the material might on occasions be described as an alloy.

Thus, the conductive material formed by atomic layer deposition of monolayers comprising ruthenium and iridium or ruthenium oxide and iridium oxide is indicated as (Ru/Ir) or ($RuO_x/IrO_x$).

The selection of a particular conductive material for the primary layer may be made so that its work function is matched with that of the CEM layer. Alternatively or additionally, it may be made so that its etching is faster or slower as compared to the CEM layer.

The selection is greatly enhanced by the use of an atomic layer deposition for the primary layer which forms a conductive material comprising sub-layers and/or monolayers of different noble metals or noble metal oxides.

Such sub-layers or monolayers may enable very precise tailoring of the work function of the primary layer not just through the selection of different noble metals, for example, but also through selection of their respective concentrations.

In one embodiment, therefore, the forming of the primary layer comprises an atomic layer deposition providing for the formation of sub-layers, for example, of different noble metals or noble metal oxides.

In another embodiment, the forming of the primary layer comprises an atomic layer deposition providing for the formation of monolayers comprising, for example, different noble metals or noble metal oxides.

In still another embodiment, the forming of the primary layer comprises providing for the formation of sub-layers as well as monolayers as described above.

Note, in this regard, that the work function of the CEM layer may vary considerably depending on the selection of the one or more metal or metal compound, for example, metal oxide and the selection of dopant. Consequently, the selections of sub-layers and/or monolayers may be different for different CEM layers.

The forming of the primary layer may comprise forming a plurality of sub-layers of different noble metals as $A_1$-$A_2$, $A_1$-$A_2$-$A_1$, $A_1$-$A_2$-$A_3$, $A_1$-$A_2/A_3$, $A_1$-$A_2/A_3$-$A_1$, $A_1$-$A_2/A_3$-$A_4$ and $A_1$-$A_2$-$A_3$-$A_4$ etc wherein $A_1$, $A_2$, $A_3$ and $A_4$ are different noble metals. It may, for example, comprise forming sub-layers as Pt/Ir/Pt or Ru/Ir/Ru or Pt/Ir/Ru or Pt/Rh/Ru or Pt/Pt-Ir/Ir or Pt/Pt-Rh/Rh or sub-layers as Pt/Rh/Pt or Pt/Rh/Pt or Ru/Rh/Ru.

Alternatively or additionally, the forming of the primary layer may comprise forming a plurality of sub-layers of different noble metal oxides such as $A_1O$-$A_2O$, $A_1O$-$A_2O$-$A_3O$, $A_1O$-$A_2O/A_3O$ and $A_1O$-$A_2O/A_3O$-$A_1O$, $A_1O$-$A_2O/A_3O$-$A_1O$ and $A_1O$-$A_2O$-$A_3O$-$A_4O$ wherein $A_1O$, $A_2O$, $A_3O$ and $A_4O$ are different metal oxides (stoichiometry not indicated). It may, for example, comprise forming sub-layers as $RuO_x/IrO_x$.

Of course, the forming of the primary layer may also comprise forming a plurality of sub-layers of noble metals and noble metal oxides such as $A_1$-$A_1O$-$A_1$, $A_1/A_2$-$A_1O$-$A_3$ wherein $A_1$, $A_2$ and $A_3$ are different noble metals. It may, for example, comprise forming sub-layers as $RuO_x$—Ru.

Note that the sub-layers may comprise a sub-layer comprising an alloy or a mixture of oxides (indicated by $M_1/M_2$, for example).

The forming of the primary layer may simply comprise forming monolayers comprising more than one noble metal or more than one noble metal oxide. In that case, the primary layer may be described as a single layer comprising an alloy and indicated as $A_1/A_2$ or $A_1/A_2/A_3$ or a mixture of oxides and indicated as $A_1O/A_2O$ or $A_1O/A_2O/A_3$.

In general, it has been found that the etching of noble metals and noble metal oxides is as difficult as etching the CEM layer and that there is not much advantage to be had in selections which take into consideration differences in the rate of etching between different noble metals and/or different noble metal oxides.

Nonetheless, it may be advantageous that the primary layer of the conductive substrate comprises a different conductive material as compared to the primary layer of the conductive overlay.

In one embodiment, therefore, the method comprises forming a primary layer for the conductive substrate and a primary layer of the conductive overlay wherein the conductive material of the primary layer of the conductive substrate is different to the conductive material of the primary layer for the conductive substrate. In this embodiment, the primary layer for the conductive overlay may, for example, be etched more quickly than that of the conductive substrate for a given etchant.

Of course, the thickness of the primary layer of the conductive overlay may also be different to that of the primary layer of the conductive substrate.

In general, however, the thickness of the primary layer will be as low as possible—not just because of the difficulty of etching but also because the secondary layer may act as a hard mask or an etch stop during etching.

Suitable thicknesses for the primary layer of the conductive substrate and the conductive overlay are below 350 Å, for example, below 250 Å and preferably, less than or equal to 200 Å.

The thickness of the secondary layer may be greater than that of the primary layer—especially when the secondary layer is to act as a hard mask or an etch stop. The thickness of the secondary layer may, for example, be greater than 200 Å and, in particular, greater than 1000 Å.

Thus, the primary layer and the secondary layer taken together may be considered to provide a conductive substrate and/or conductive overlay having a bulk portion (secondary layer) and a liner portion (primary layer).

Note that in all the foregoing aspects and embodiments, the organometallic precursors and the process conditions, such as temperature, pressure and flow rate, should be selected so that the primary layer is free from organic or other impurities at concentrations which may cause it to switch between a relatively conductive state and a relatively insulative state.

The forming of the primary layer may, in some instances, include an annealing in order to remove such impurities. The annealing may be carried out in situ or subsequently in an inert atmosphere at a temperature between 20° C. and 1000° C.

Note further that the forming of the primary layer may alternatively use a metallo-organic chemical vapour deposition from organic precursors similar to those mentioned above. This vapour deposition may also provide sub-layers and monolayers as described for atomic layer deposition (albeit with lesser control).

As mentioned above, the conductive material of the secondary layer may comprise any material which is susceptible to oxidation at temperatures between 20° C. and 1000° C.—and especially one which may lead to an interfacial layer of high resistivity if it were to contact the CEM layer.

Suitable conductive materials for the secondary layer include transition metals and transition metal compounds such as titanium, tantalum, tungsten, copper, cobalt, aluminium, nickel, titanium nitride, tantalum nitride, tungsten nitride and silicides such as nickel silicide as well as polysilicon.

In some embodiments, therefore, the forming of the secondary layer comprises forming a layer of one or more of titanium nitride, tantalum nitride or tungsten nitride.

In other embodiments, the forming of the secondary layer comprises forming a layer of one or more of copper, cobalt, aluminum, nickel, titanium, tantalum or tungsten.

Of course, the forming of the secondary layer may comprise forming layers comprising mixtures of these conductive materials.

The method may utilise a physical vapour deposition or a chemical vapour deposition to form the secondary layer. The method may, for example, comprise forming the secondary layer by one or more of atomic layer deposition (which may be a laser- or plasma-enhanced), a chemical vapour deposition (which may be a laser- or plasma-enhanced), rapid thermal or hot wire chemical vapour deposition, electron or ion beam chemical vapour deposition, sputtering, ion beam sputtering, reactive sputtering, ion plating.

Note that the forming of the secondary layer of the conductive overlay is on the primary layer and the forming of the secondary layer of the conductive substrate is on another substrate such as a silicon wafer.

Note further that notwithstanding that the secondary layer of the conductive overlay may comprise different conductive material as compared to the secondary layer of the conductive substrate, the forming of these secondary layers may utilise substantially the same methods. Accordingly, except where context suggests otherwise, references to forming the secondary layer in the foregoing aspects and embodiments may be interpreted as relating to forming a secondary layer for either the conductive substrate or the conductive overlay.

In certain embodiments, the forming of the secondary layer comprises sputtering of a target comprising a metal, such as copper, cobalt, aluminium, nickel, titanium, tantalum or tungsten or a metal nitride such as titanium nitride, tantalum nitride or tungsten nitride.

In other embodiments, the forming of the secondary layer comprises reactive sputtering of a metal such as titanium, tantalum or tungsten in a nitrogen atmosphere.

In still other embodiments, the forming of the secondary layer comprises an atomic layer deposition in accordance with the expression (10):

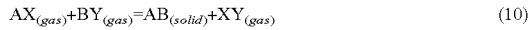

$$AX_{(gas)} + BY_{(gas)} = AB_{(solid)} + XY_{(gas)} \qquad (10)$$

wherein "A" corresponds to titanium, tantalum or tungsten, "AB" corresponds to titanium nitride, tantalum nitride or tungsten nitride and "BY" comprises a reducing agent such as ammonia ($NH_3$), nitrogen ($N_2$).

In these embodiments, "X" may comprise one or more of a ligand such as an organic ligand, such as dimethylamido ($Me_2N$—), diethylamido ($Et_2N$—), tert-butylimido ($^tBuN$=), carbonyl (—CO), ethoxy (—OEt) i-propoxyl (—O$^i$Pr), amido ($NH_3$—), 1- or 2-methylbutylisontrilo (MeBuNC—) and cyclo-pentadienyl (Cp). Alternatively "X" may comprise a ligand such as a halogen and, in particular, fluoro (—F), chloro (—Cl) or bromo (—Br) as well as a β-diketone or an amidinate such N,N'-di-sec butylacetamidinate or N,N'-diallylacetamidinate.

Accordingly, a titanium-based precursor may comprise titanium tetrachloride ($TiCl_4$), titanium tetraisopropoxide (TTIP), tetrakis(dimethylamido)titanium (TDMAT) or tetrakis(diethyl-amido)titanium (TDEAT). In other embodiments, a tantalum-based precursor may comprise pentakis(dimethylamido)tantalum (PDMAT), tantalum ethoxide (TAETO) or tantalum pentachloride. In still other embodiments, a tungsten-based precursor may comprise tungsten hexafluoride, tungsten hexacarbonyl, triamminetricarbonyltunsten, cyclopentadienyltungsten tricarbonyl hydride or tungsten pentacarbonyl 1-methylbutylisonitrile or bis(t-butylimido)-bis-(dimethylamido)tungsten.

The conductive material of the secondary layer may comprise a metal or a metal oxide which is susceptible to oxidation at temperatures between 20° C. and 1000° C.

In certain embodiments, therefore, the forming of the secondary layer comprises sputtering of a target comprising a metal such as tungsten or titanium or a metal silicide, such as nickel silicide in an inert atmosphere.

In other embodiments, the forming of the secondary layer comprises an atomic layer deposition in accordance with the expression (11):

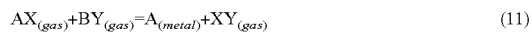

$$AX_{(gas)} + BY_{(gas)} = A_{(metal)} + XY_{(gas)} \qquad (11)$$

wherein "A" corresponds to titanium, tungsten, "X" corresponds to one or more of an organic ligand such as those described above and "BY" comprises a reducing agent such as hydrogen ($H_2$).

In still other embodiments, the forming of the secondary layer comprises an atomic layer deposition in accordance with the expression (11):

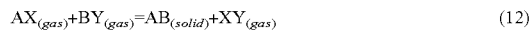

$$AX_{(gas)} + BY_{(gas)} = AB_{(solid)} + XY_{(gas)} \qquad (12)$$

wherein "A" corresponds to titanium, "AB" corresponds to a metal oxide, "X" corresponds to one or more of a ligand such as those described above and "BY" comprises an oxidant such as oxygen ($O_2$) or ozone ($O_3$).

Such depositions may, in particular, be carried out at a temperature between 100° C. and 500° C. Note that organometallic precursors and process conditions, such as temperature, pressure and flow rate, are chosen so that the conductive material of the secondary layer is substantially free from concentrations of impurities which may cause the material to switch between a relatively conductive state and a relatively insulative state.

The forming of the secondary layer may, in some instances, include an annealing carried out in an inert atmosphere at a selected temperature or temperatures between 20° C. and 1000° C. in order to remove such organic impurities.

The method may, in particular, comprise forming the CEM layer by depositing an oxide of a d- or f-block element—especially one having an incomplete d- or f-electron shell. The metal oxide may, in particular, comprise an oxide of nickel, aluminum, cadmium, chromium, cobalt, copper, gold, iron, manganese, mercury, molybdenum, nickel, palladium, rhenium, ruthenium, silver, tin, titanium or vanadium. Note that compounds that comprise more than one metal oxide may also be utilized, including rare earth transition metal perovskites and other mixed oxides, such yttrium titanate ($YTiO_3$).

The method may utilise a physical vapour deposition or a chemical vapour deposition to form the CEM layer. It may, for example, comprise forming the CEM layer by one or more of atomic layer deposition (which may be a laser- or plasma-enhanced), a chemical vapour deposition (which may be a laser- or plasma-enhanced), rapid thermal or hot wire chemical vapour deposition, electron or ion beam chemical vapour deposition, sputtering, ion beam sputtering, reactive sputtering, ion plating.

The forming of the CEM layer may provide for doping by one or more dopants establishing and/or stabilising variable impedance properties in the CEM layer.

The forming of the CEM layer may, for example, comprise forming a variable impedance transition metal oxide which is doped by a ligand L, for example, NiO:L$_x$ where L is a ligand element or compound and x indicates a number of units of the ligand for one unit of NiO.

The method may, for example, form a CEM layer comprising nickel oxide doped by a back donating carbon-containing ligand, such as carbonyl (NiO:CO).

The method may, for example, form a CEM layer comprising nickel oxide doped by another back donating ligand, such as nitrosyl (NO), triphenylphosphino (PPh$_3$), 1,10-phenanthrolino (C$_{12}$H$_8$N$_2$), 2,2'-bipyridine (C$_{10}$H$_8$N$_2$), ethylenediamine (C$_2$H$_8$N$_2$), ammonia (NH$_3$), acetonitrile (CH$_3$CN), fluoride (F), chloride (Cl), bromide (Br), cyanide (CN) and sulfur (S).

The dopant or dopants may be derived from one or more ligands to an organometallic precursor molecule used for depositing the metal oxide by one or more of the aforementioned processes. Such dopants may comprise or derive from carbon-containing ligands, such as cyclopentadienyl, or nitrogen-containing ligands, such as alkylamido, imido, amidinate and the like.

Alternatively or additionally, the dopant or dopants may comprise a ligand derived from a molecule introduced to the process for that purpose. The extrinsic dopant may, for example, be derived from a nitrogen-containing molecule of the form C$_x$H$_y$N$_z$ in which x, y≥0 and N≥1, such as ammonia (NH$_3$), cyanide (CN$^-$), azide (N$_3^-$), ethylenediamine (C$_2$H$_8$N$_2$), 1,10-phenanthroline (C$_{12}$H$_8$N$_2$) 2,2'-bipyridine (C$_{10}$H$_8$N$_2$), pyridine (C$_5$H$_5$N), acetonitrile (CH$_3$CN) and cyanosulfanides such as thiocyanate (NCS$^-$). Alternatively, the extrinsic dopant may be derived from nitrogen oxides (N$_x$O$_y$) such as nitric oxide (NO), nitrous oxide (N$_2$O), nitrogen dioxide (NO$_2$) and nitrate (NO$_3^-$).

In a particular embodiment, the forming of the CEM layer comprises an atomic layer deposition, for example, depositing nickel oxide materials, such as NiO:CO or NiO:NH$_3$, providing electron back-donation during operation of the CEM device in a circuit environment, for example, to give rise to a low-impedance state. Also during operation in a circuit environment, for example, electron back-donation may be reversed so as to give rise to a substantially dissimilar impedance state, such as a high-impedance state, for example.

In particular embodiments, the forming of the CEM layer comprises an atomic layer deposition in accordance with the expression (13):

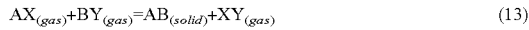

$$AX_{(gas)} + BY_{(gas)} = AB_{(solid)} + XY_{(gas)} \quad (13)$$

wherein "A" corresponds to a transition or other metal, and "AB" a transition or other metal compound, such as a transition metal oxide.

In these embodiments, "X" of expression (13) may comprise one or more organic ligands, such as amidinate (AMD), dicyclopentadienyl (Cp)$_2$, diethylcyclopentadienyl (EtCp)$_2$, bis(2,2,6,6-tetramethylheptane-3,5-dionato) ((thd)$_2$), acetylacetonate (acac), bis(methylcyclopentadienyl) ((CH$_3$C$_5$H$_4$)$_2$) dimethylglyoximate (dmg)$_2$, 2-amino-pent-2-en-4-onato (apo)$_2$, (dmamb)$_2$ where dmamb=1-dimethylamino-2-methyl-2-butanolate, (dmamp)$_2$ where dmamp=1-dimethylamino-2-methyl-2-propanolate, bis(pentamethylcyclopenta-dienyl) (C$_5$(CH$_3$)$_5$)$_2$ and carbonyl (CO)$_4$.

Accordingly, in some embodiments, a nickel-based precursor AX may comprise, for example, nickel amidinate (Ni(AMD)), nickel dicylcopentadienyl (Ni(Cp)$_2$), nickel diethylcyclopentadienyl (Ni(EtCp)$_2$), bis(2,2,6,6-tetramethylheptane-3,5-dionato)Ni(II) (Ni(thd)$_2$), nickel acetylacetonate (Ni(acac)$_2$), bis(methyl-cyclopentadienyl)nickel (Ni(CH$_3$C$_5$H$_4$)$_2$, nickel dimethylglyoximate (Ni(dmg)$_2$), nickel 2-amino-pent-2-en-4-onato (Ni(apo)$_2$), Ni(dmamb)$_2$ where dmamb=1-dimethylamino-2-methyl-2-butanolate, Ni(dmamp)$_2$ where dmamp=1-dimethylamino-2-methyl-2-propanolate, bis(pentamethylcyclo-pentadienyl) nickel (Ni(C$_5$(CH$_3$)$_5$)$_2$ or nickel carbonyl (Ni(CO)$_4$).

In expression (13), precursor "BY" may comprise an oxidising agent, such as oxygen (O$_2$), ozone (O$_3$), nitric oxide (NO) or hydrogen peroxide (H$_2$O$_2$. In other embodiments, a plasma may be used with an oxidising agent to form oxygen radicals.

However, in particular embodiments, a dopant comprising a back-donating material in addition to precursors AX and BY may be utilized to form the CEM layer. An additional dopant ligand comprising a back-donating material, which may co-flow with precursor AX, may permit formation of back-donating compounds, substantially in accordance with expression (14), below.

In particular embodiments, a dopant comprising a back-donating material, such as ammonia (NH$_3$), methane (CH$_4$), carbon monoxide (CO), or other material may be utilized, as may other ligands comprising carbon or nitrogen or other dopants comprising back-donating materials listed above. Thus, expression (13) may be modified to include an additional dopant ligand comprising a back-donating material substantially in accordance with expression (14), below:

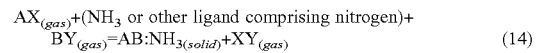

$$AX_{(gas)} + (NH_3 \text{ or other ligand comprising nitrogen}) + BY_{(gas)} = AB:NH_{3(solid)} + XY_{(gas)} \quad (14)$$

In expression (14), "BY" may comprise an oxidizer, such as oxygen (O$_2$), ozone (O$_3$), nitric oxide (NO) or hydrogen peroxide (H$_2$O$_2$). In other embodiments, a plasma may be used with an oxidizer (BY) to form oxygen radicals. Likewise, a plasma may be used with the doping species comprising a back-donating material to form an activated species to control the doping concentration of the primary CEM layer.

Note that concentrations, such as atomic concentration, of precursors, such as AX, BY, and NH$_3$ (or other ligand comprising nitrogen) of expressions (13) and (14) may be adjusted so as to bring about a final atomic concentration of nitrogen or carbon dopant comprising a back-donating material in a fabricated CEM device, such as in the form of ammonia (NH$_3$) or carbonyl (CO), between approximately 0.1% and 15.0%.

In particular embodiments, such as embodiments utilizing atomic layer deposition, a substrate may be exposed to precursors, such as AX and BY, as well as compounds providing back-donating ligands (such as ammonia or other ligands comprising metal-nitrogen bonds, including, for example, nickel-amides, nickel-imides, nickel-amidinates, or combinations thereof) at a temperature or temperatures between of 20° C. to 1000° C. and, in particular, between 20° C. and 750° C. or between 20° C. and 400° C.

In particular embodiments, responsive to one or more two-precursor cycles (e.g., AX and BY), or three-precursor cycles (AX, NH$_3$, CH$_4$ or other ligand comprising nitrogen, carbon or other dopant comprising a back-donating material and BY), of an atomic layer deposition, a primary CEM layer may undergo in situ annealing, which may permit improvement of layer properties or may be used to incorporate the dopant comprising a back-donating material, such as in the form of carbonyl or ammonia, in the CEM layer.

In certain embodiments, in situ annealing may be performed at a temperature or temperatures between 20.0° C. to 100.0° C. However, in other embodiments, in situ annealing may be performed utilizing temperatures between 20.0° C. to 750.0° C. In situ annealing times may vary from a duration approximately in the range of 1.0 seconds to 5.0 hours. In particular embodiments, annealing times may vary within more narrow ranges, such as, for example, between 0.5 minutes to and 180.0 minutes.

In one embodiment, an atomic layer deposition may be used for depositing the conductive substrate, the CEM layer and the conductive overlay. This atomic layer deposition may, for example, employ the same or a different organo-metallic precursor for forming the CEM layer as compared to that for the conductive substrate and/or the conductive overlay and an oxidising agent as compared to a reducing agent.

Note that the selection of the conductive materials for the primary layer and the temperatures at which the deposition of the various layers in the CEM switching device should be chosen having regard to the likelihood of oxidation of the primary layer by the CEM layer.

For example, the forming of the CEM layer on the primary layer of the conductive substrate should be carried out at a selected temperature at which oxidation of the conductive material of the primary layer is resistant to oxidation.

Likewise, the forming of the primary layer and secondary layer of the conductive overlay should be carried out at temperatures at which oxidation of the conductive material is resistant to oxidation.

In embodiments in which a (plasma-enhanced) atomic layer deposition is used, the selection of conductive materials for the primary and secondary layers as well as the selection of the metal oxide of the CEM layer may be made so that the deposition of the various layers uses the same or an increasing temperature as they are formed.

In a fourth aspect, the present disclosure provides a switching device comprising a conductive substrate, and a layer of a correlated electron material (CEM), wherein the conductive substrate comprises a primary layer of a conductive material and a secondary layer of a conductive material wherein the primary layer contacts the CEM layer and is substantially resistant to diffusion or migration of oxygen ion from the CEM layer to the secondary layer.

In a fifth aspect, the present disclosure provides a switching device, comprising a layer of a correlated electron material (CEM) and a conductive overlay, wherein the conductive overlay comprises a primary layer of a conductive material and a secondary layer of a conductive material wherein the primary layer contacts the CEM layer and is substantially resistant to diffusion or migration of oxygen ion from the CEM layer to the secondary layer.

In a sixth aspect, the present disclosure provides a switching device comprising a conductive substrate, a conductive overlay and a layer of a correlated electron material (CEM) therebetween wherein the conductive substrate and/or the conductive overlay comprises a primary layer of a conductive material and a secondary layer of a conductive material wherein the primary layer contacts the CEM layer and is substantially resistant to diffusion or migration of oxygen ion from the CEM layer to the secondary layer.

The conductive material of the primary layer may, for example, be resistant to diffusion or migration of oxygen ion at temperatures between 20° C. and 1000° C. or up to 450° C., 600° C., 700° C., 800° C. or 900° C.

The conductive material of the primary layer may also be resistant to oxidation by the CEM layer at these temperatures. However, it may be susceptible to oxidation at these temperatures provided that the primary layer remains relatively conductive as compared to the CEM layer.

The secondary layer need not be resistant to oxidation at temperatures above 100° C. It may be different to that of the primary layer and, in particular, chosen for its etching properties as compared to those of the conductive material of the primary layer.

Suitable conductive materials for the primary layer include noble metals and alloys thereof. The primary layer may, therefore, comprise one or more of ruthenium, rhodium, palladium, silver, osmium, iridium, platinum, gold, copper and rhenium.

Other suitable conductive materials for the primary layer include conductive metal oxides and mixtures thereof. The primary layer may, therefore, comprise one or more of a conductive metal oxide, in particular, one or more of a noble metal oxide such as ruthenium oxide ($RuO_x$), iridium oxide ($IrO_x$) and platinum oxide ($PtO_x$).

Still other suitable conductive materials for the primary layer include mixtures of a noble metal and a conductive metal oxide such as iridium ruthenium oxide (Ir—$RuO_x$). Accordingly, the primary layer may comprise one or more of iridium ruthenium oxide (Ir—$RuO_x$), ruthenium iridium oxide (Ru—$IrO_x$), ruthenium platinum oxide (Ru—$PtO_x$), platinum ruthenium oxide (Pt—$RuO_x$) and the like.

As mentioned above, conductive materials such as ruthenium titanium nitride (Ru—TiN) can remain conductive even after exposure to an oxidising environment at relatively high temperatures. The primary layer may, therefore, comprise one or more of ruthenium titanium nitride (Ru—TiN), platinum titanium nitride (Pt—TiN), iridium titanium nitride (Ir—TiN), palladium titanium nitride (Pd—TiN), ruthenium tantalum nitride (Ru—TaN), platinum tantalum nitride (Pt—TaN), iridium tantalum nitride (Ir—TaN) and palladium tantalum nitride (Pd—TaN) and the like.

Other suitable conductive materials for the primary layer may similarly comprise a noble metal and a transition metal silicide such as nickel silicide which are relatively conductive even after exposure to an oxidising environment at relatively high temperatures. The primary layer may, therefore, comprise one or more of ruthenium nickel silicide (Ru—NiSi), platinum nickel silicide (Pt—NiSi), rhodium nickel silicide (Rh—NiSi), iridium nickel silicide (Ir—NiSi) and palladium nickel silicide (Pd—NiSi) and the like.

Still other suitable conductive materials for the primary layer comprise alloys of a noble metal and a transition metal, such as copper, cobalt, aluminium, nickel or a noble metal and polycrystalline silicon which are relatively conductive even after exposure to an oxidising environment at relatively high temperatures. The primary layer may, therefore, comprise one or more of an alloy such as Ru—Al, Ru—Cu, Ru—Co or Ru—Ni, or Ru-polysilicon, Pt-polysilicon or Ir-polysilicon and the like.

Still other suitable conductive materials for the primary layer include noble metal silicides, such as ruthenium silicide ($Ru_2Si_3$), which are relatively conductive even after exposure to an oxidising environment at 700° C. The primary layer may, therefore, comprise one or more of ruthenium silicide ($Ru_2Si_3$), platinum silicide (PtSi), iridium silicide (IrSi) and the like.

In one embodiment, the primary layer comprises a plurality of sub-layers, for example, of different noble metals or noble metal oxides.

In another embodiment, the primary layer comprises a monolayer of different noble metals or noble metal oxides. In still another embodiment, the primary layer comprises sub-layers as well as monolayers as described above. As mentioned above, the selections of sub-layers and/or monolayers may be different for different CEM layers.

The primary layer may, therefore, comprise a plurality of sub-layers of different noble metals as $A_1$-$A_2$, $A_1$-$A_2$-$A_1$, $A_1$-$A_2$-$A_3$, $A_1$-$A_2$/$A_3$, $A_1$-$A_2$/$A_3$-$A_1$, $A_1$-$A_2$/$A_3$-$A_4$ and $A_1$-$A_2$-$A_3$-$A_4$ etc wherein $A_1$, $A_2$, $A_3$ and $A_4$ are different noble metals. It may, for example, comprise three sub-layers as Pt/Ir/Pt or Ru/Ir/Ru or Pt/Ir/Ru or two sub-layers as Pt/Pt-Ir/Ir.

Alternatively or additionally, the primary layer may comprise a plurality of sub-layers of different noble metal oxides such as $A_1O$-$A_2O$, $A_1O$-$A_2O$-$A_3O$, $A_1O$-$A_2O$/$A_3O$ and $A_1O$-$A_2O$/$A_3O$-$A_1O$, $A_1O$-$A_2O$/$A_3O$-$A_1O$ and $A_1O$-$A_2O$-$A_3O$-$A_4O$ wherein $A_1O$, $A_2O$, $A_3O$ and $A_4O$ are different metal oxides (stoichiometry not indicated). It may, for example, comprise two sub-layers as $RuO_x$/$IrO_x$.

Of course, the primary layer may also comprise a plurality of sub-layers of noble metals and noble metal oxides such as $A_1$-$A_1O$-$A_1$, $A_1$/$A_2$-$A_1O$-$A_3$ wherein $A_1$, $A_2$ and $A_3$ are different noble metals. It may, for example, comprise two sub-layers as $RuO_x$/Ru.

The primary layer may simply comprise monolayers comprising more than one noble metal or more than one noble metal oxide. In that case, the primary layer may be described as a single layer comprising an alloy such as $A_1$/$A_2$ or $A_1$/$A_2$/$A_3$ or a mixture of oxides such as $A_1O$/$A_2O$ or $A_1O$/$A_2O$/$A_3$.

As mentioned above, it may be advantageous that the primary layer of the conductive substrate comprises a different conductive material as compared to the primary layer of the conductive overlay.

In one embodiment, therefore, the primary layer of the conductive overlay comprises a conductive material which is different from that of the conductive substrate. In this embodiment, the primary layer for the conductive overlay may, for example, be etched more quickly than that of the conductive substrate for a given etchant.

Of course, the thickness of the primary layer of the conductive overlay may also be different to that of the primary layer of the conductive substrate.

Suitable thicknesses for the primary layer of the conductive substrate and the conductive overlay are below 350 Å, for example, below 250 Å and preferably, less than or equal to 200 Å.

The thickness of the secondary layer may be greater than that of the primary layer—especially when the secondary layer is to act as a hard mask or an etch stop. The thickness of the secondary layer may, for example, be greater than 200 Å and, in particular, greater than 1000 Å.

Suitable thicknesses for the CEM layer are between 1.5 nm and 150.0 nm.

As mentioned above, the conductive material of the secondary layer may comprise any material which is susceptible to oxidation at temperatures between 20° C. and 1000° C.—and especially one which may lead to an interfacial layer of high resistivity if it were to contact the CEM layer.

Suitable conductive materials for the secondary layer include transition metals and transition metal compounds such as copper, cobalt, aluminium, nickel, titanium, tantalum, tungsten, titanium nitride, tantalum nitride, tungsten nitride, silicides such as nickel silicide as well as polysilicon.

In some embodiments, therefore, the secondary layer comprises one or more of titanium nitride, tantalum nitride or tungsten nitride. In other embodiments, the secondary layer comprises one or more of copper, cobalt, aluminium, nickel, titanium, tantalum or tungsten. Of course, the secondary layer may also comprise mixtures of these conductive materials.

The CEM layer may, in particular, comprise an oxide of a d- or f-block element—especially one having an incomplete d- or f-electron shell. The metal oxide may, in particular, comprise an oxide of nickel, aluminum, cadmium, chromium, cobalt, copper, gold, iron, manganese, mercury, molybdenum, nickel, palladium, rhenium, ruthenium, silver, tin, titanium or vanadium. Note that compounds that comprise more than one metal oxide may also be utilized, including rare earth transition metal perovskites and other mixed oxides, such yttrium titanate ($YTiO_3$).

The CEM layer may be doped by one or more dopants establishing and/or stabilising variable impedance properties in the CEM layer.

The CEM layer may comprise a variable impedance transition metal oxide which is doped by a ligand L, for example, NiO:Lx where L is a ligand element or compound and x indicates a number of units of the ligand for one unit NiO.

The CEM layer may, in particular, comprise nickel oxide which is doped by a back donating carbon-containing ligand, such as carbonyl (forming NiO:CO).

Other suitable back donating ligands include nitrosyl (NO), triphenylphosphine ($PPh_3$), 1,10-phenanthroline ($C_{12}H_8N_2$), 2,2'-bipyridine ($C_{10}H_8N_2$), ethylenediamine ($C_2H_8N_2$), ammonia ($NH_3$), acetonitrile ($CH_3CN$), fluoride (F), chloride (Cl), bromide (Br), cyanide (CN) and sulfur (S).

The dopant or dopants may be derived from one or more ligands to an organometallic precursor molecule used for depositing the metal oxide by one or more of the aforementioned processes. Such dopants may comprise or derive from carbon-containing ligands, such as cyclopentadienyl, or nitrogen-containing ligands, such as alkylamido, imido, amidinate and the like.

The CEM layer may comprise a variable impedance transition metal oxide including a dopant derived from a nitrogen-containing molecule of the form $C_xH_yN_z$ in which x, y≥0 and N≥1, such as ammonia ($NH_3$), cyanide ($CN^-$), azide ($N_3^-$), ethylenediamine ($C_2H_8N_2$), 1,10-phenanthroline ($C_{12}H_8N_2$), 2,2'-bipyridine ($C_{10}H_8N_2$), pyridine ($C_5H_5N$), acetonitrile ($CH_3CN$) and cyanosulfanides such as thiocyanate ($NCS^-$). Alternatively, the CEM layer may comprise a variable impedance transition metal oxide including a dopant derived from nitrogen oxides ($N_xO_y$) such as nitric oxide (NO), nitrous oxide ($N_2O$), nitrogen dioxide ($NO_2$) as well as nitrate ($NO_3^-$).

In particular embodiments, changes in impedance states of the CEM layer, such as from a low-impedance state to a substantially dissimilar high-impedance state, for example, may be brought about by the "back-donation" of electrons of compounds comprising $Ni_xO_y$ (wherein the subscripts "x" and "y" comprise whole numbers).

As the term is used herein, "back-donation" refers to a supplying of one or more electrons to a transition metal, transition metal oxide, or any combination thereof, by an adjacent molecule of the lattice structure, for example, comprising the transition metal, transition metal compound, transition metal oxide, or combination thereof. Back-donation permits a transition metal, transition metal compound, transition metal oxide, or combination thereof, to maintain an ionization state that is favorable to electrical conduction under an influence of an applied voltage.

In certain embodiments, back-donation in a CEM, for example, may occur responsive to use of carbonyl (CO) or a nitrogen-containing dopant comprising a back-donating material, such as ammonia ($NH_3$), ethylene diamine ($C_2H_8N_2$), or members of a nitrogen oxide family ($N_xO_y$), for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in nickel oxide material (e.g., NiO:CO or NiO:$NH_3$), thereby permitting the nickel oxide material to switch to exhibiting a substantially dissimilar impedance property, such as a high-impedance property, during device operation.

Thus a back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the material.

In some embodiments, by way of back-donation, the CEM layer may exhibit low-impedance properties if the transition metal, nickel for example, is placed into an oxidation state of 2+ (e.g., $Ni^{2+}$ in a material, such as NiO:CO or NiO:$NH_3$). Conversely, electron back-donation may be reversed if the transition metal, nickel for example, is placed into an oxidation state of either 1+ or 3+. Accordingly, during operation of the CEM switching device, back-donation may result in a "disproportionation," which may comprise substantially simultaneous oxidation and reduction reaction, substantially in accordance with the expression (15) below:

$$2Ni^{2+} \rightarrow Ni^{1+} + Ni^{3+} \quad (15)$$

Such disproportionation may bring about, for example, a relatively high-impedance state during operation of the CEM switching device.

In some embodiments, a dopant comprising a back-donating material, such as a carbon containing ligand, carbonyl (CO) or a nitrogen-containing ligand, such as an ammonia molecule ($NH_3$), may permit sharing of electrons during operation of the CEM switching device so as to permit the disproportionation and its reversal, substantially in accordance with the expression (16) below:

$$Ni^{1+} + Ni^{3+} \rightarrow 2Ni^{2+} \quad (16)$$

A reversal of the disproportionation reaction permits the nickel-based CEM switching device to return to a relatively low-impedance state.

$V_{reset}$ and $V_{set}$, as shown in FIG. 1A, may vary, depending on a molecular concentration of NiO:CO or NiO:$NH_3$ (for example, between 0.1 atom % and 15.0 atom %), in the range of approximately 0.1 V to 10.0 V subject to the condition that $V_{set} \geq V_{reset}$. For example, $V_{reset}$ may occur at a voltage approximately in the range of 0.1 V to 1.0 V, and $V_{set}$ may occur at a voltage approximately in the range of 1.0 V to 2.0 V. It should be noted, however, that variations in $V_{set}$ and $V_{reset}$ may occur based, at least in part, on other process variations.

In some embodiments, the CEM layer may exhibit a "born on" property in which it exhibits a relatively low impedance (relatively high conductivity) following the manufacture of the device. Accordingly, if the CEM switching device is integrated into a larger electronics environment, for example, at initial activation a relatively small voltage applied to a CEM device may permit a relatively high current flow through the CEM switching device, as shown by region 104 of FIG. 1A. For example, as previously described herein, $V_{reset}$ may occur at a voltage approximately in the range of 0.1 V to 1.0 V, and $V_{set}$ may occur at a voltage approximately in the range of 1.0 V to 2.0 V. Accordingly, electrical switching voltages operating in a range of approximately 2.0 V, or less, may permit a memory circuit, for example, to write to a CERAM memory device, to read from a CERAM memory device, or to change state of a CERAM switch, for example. Such relatively low voltage operation may reduce complexity, cost, and may provide other advantages over competing memory and/or switching device technologies.

The method may form a CEM layer of any suitable thickness and, in particular, a CEM layer having a thickness between 1.5 nm and 150.0 nm by an atomic layer or other deposition.

The present disclosure provides a method for the manufacture of a CEM switching device which may avoid the formation of interfacial layers, such as oxide layers between the CEM layer and the conductive substrate and/or conductive overlay.

The use of primary and secondary layers for a conductive substrate and/or conductive overlay avoids significant cost which may arise from requirements relating to thickness and integration to existing integrated circuit boards of a CEM switching device in which the conductive substrate and/or conductive overlay is a single layer of a noble metal or noble metal oxide.

Such requirements typically mean that the thickness of a conductive substrate and a conductive overlay is 200 Å or more. A secondary layer may make up the major part of that thickness and may comprise a conductive material that is considerably cheaper to deposit than a noble metal or noble metal oxide. It may comprise a wide variety of materials and, as mentioned above, need not comprise a material which is resistant to oxidation at temperatures between 50° C. and 900° C.

The secondary layer may provide the hard mask or etch stop which is often necessary to the definition of the CEM switching device before its integration to an integrated circuit board. It may thus avoid problems, such as unintended damage to the CEM layer, which may arise during prolonged etching of noble metals and noble metal oxides.

The primary layer may provide that the conductive material secondary layer is chosen more for its etching properties than the compatibility of its work function with the CEM layer.

The primary layers largely encapsulate the CEM layer and may serve to prevent the CEM switching device from "seeing" other CEM switching devices in an array of CEM switching devices provided in an integrated circuit board.

The use of a (plasma-enhanced) atomic layer deposition to form the primary layer may enable very precise control over its work function and etching properties. The work function can be tailored to the CEM layer or secondary layer by forming a plurality of sub-layers comprising different noble metals and/or noble metal oxides or by forming monolayers comprising an alloy of noble metals or a mixture of noble metal oxides.

Further embodiments of the presently disclosed CEM switching device and methods for its manufacture will be apparent from the following description and Figures in which FIG. 1A shows a schematic illustration of a current density versus voltage profile of a CEM switching device;

Figure 1A:
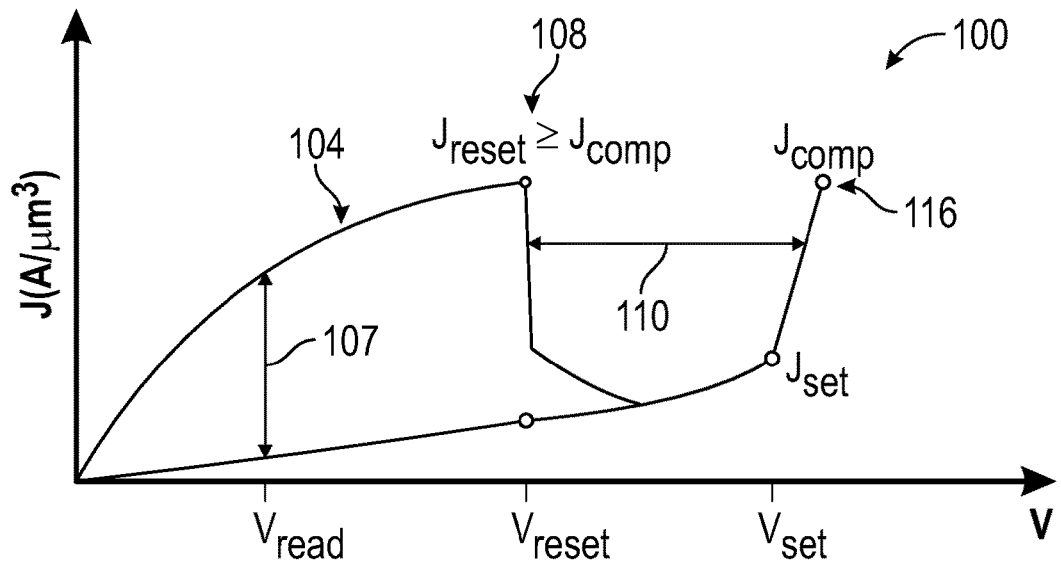
FIG. 1B shows a schematic illustration of the CEM switching device of FIG. 1A and a schematic diagram of an equivalent circuit for the switching device.
Figure 1B:
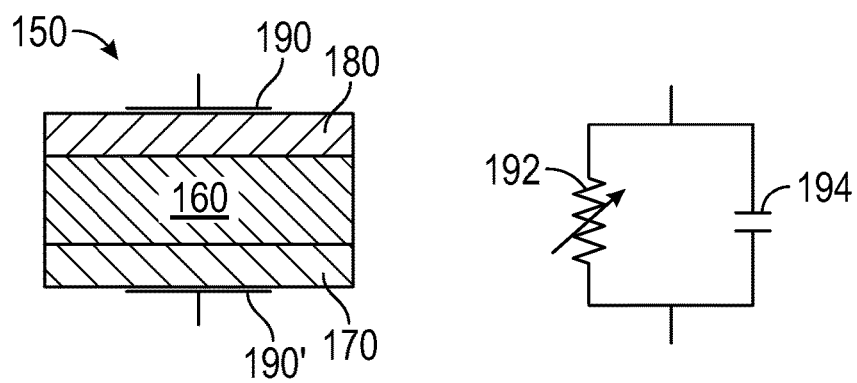
Figure 2A:
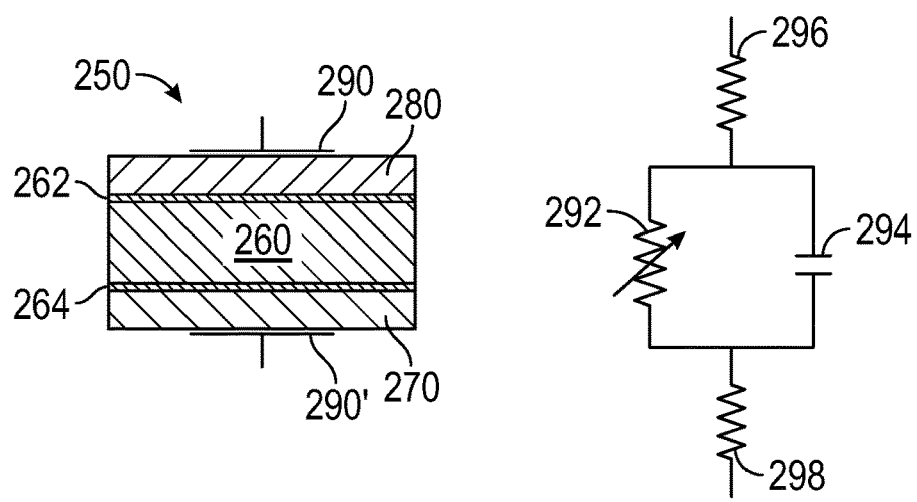
FIG. 2A shows a schematic illustration of a CEM switching device having an oxide as interfacial layers between a conductive substrate and CEM layer and a schematic equivalent circuit for the switching device.

Referring now to FIG. 2A, there is shown a switching device 250, such as may be used as a storage element, wherein interfacial layers 262 and 264 of a relatively high impedance oxide have formed between the CEM layer 260 and the conductive substrate 270 and conductive overlay 280. The device may be represented by a circuit diagram similar to that shown for the device of FIG. 1 except that it also comprises series resistors 296 and 298. The conductive substrate and/or conductive overlay may comprise a titanium nitride fabricated in layers utilizing, for example, sputtering, chemical vapor deposition, atomic layer deposition, or other suitable process and the CEM layer may comprise nickel oxide, for example, Ni:CO fabricated in layers utilizing, for example, atomic layer deposition or other suitable processes.

As shown in FIG. 2A, an oxidation layer 262 may be present and may be modeled using equivalent resistance disposed between device terminal 290 and the parallel combination of variable resistance 292 with variable capacitance 294. Likewise, the oxidation layer 264 may be modeled using equivalent resistance 298 disposed between device terminal 290' and the parallel combination of variable resistance 292 with variable capacitance 294. The resistances 296 and 298 may bring about degraded electrical performance of a CEM switching device.

In this device, responsive to application of a voltage within a particular range, such as, for example, between approximately 3.0 V and approximately 4.0 V, oxidation layer 262 may develop one or more filaments which may comprise conductive crystalline, low-resistance paths between conductive overlay 280 and the CEM layer 260. Likewise, a voltage of between, for example, approximately 3.0 V and approximately 4.0 V may bring about formation of filaments in oxidation layer 264 between the CEM layer 260 and conductive substrate 270. Formation of filaments may bring about operation of a switching device that more closely approximates the current density versus voltage profile of FIG. 1A.

Thus, $V_{read}$, $V_{reset}$, and $V_{set}$ may be substantially (and undesirably) increased. In one possible example, $V_{set}$ may comprise a voltage level approximately in the range of 3.0 V to 4.0 V, for example. Thus, electrical switching voltages to bring about a change of state of a CERAM memory device, for example, may be increased significantly, such as from approximately 1.0 V to 2.0 V as described in reference to FIG. 1A, for example, to 3.0 V to 4.0 V, at least in certain instances as described with reference to FIG. 2A.

Although the formation of filaments within the oxidation layers 262 and 264 may permit the device to perform switching operations responsive to application of voltage levels approximately in the range of 2.0 V, or less, for example, the need to apply filament-forming voltages of, for example, approximately 3.0 V to approximately 4.0 V may be undesirable.

Accordingly, in certain devices, it may be advantageous to reduce or eliminate a need to form conductive filaments so as to allow a low-impedance path for electrical current flowing from conductive substrate to CEM film and to conductive material, for example.

Avoidance of a need for filament-forming ("breakdown") voltages may preserve the "born on" property of a CEM switching device, which refers to a CEM switching device's ability to exhibit a relatively low impedance (relatively high conductivity) responsive to fabrication of the device.

Figure 3A:
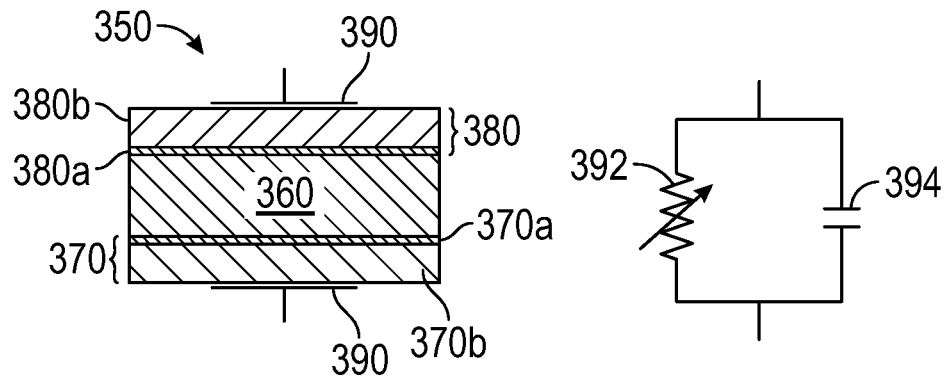
FIG. 3A shows a schematic illustration of one embodiment of the CEM switching device of the present disclosure and a schematic diagram of an equivalent circuit for the switching device.

Referring now to FIG. 3A, there is shown a CEM switching device 350, such as may be used as a CERAM memory storage device, wherein a CEM layer 360 comprising a doped metal oxide, such as NiO:CO, is sandwiched between a conductive substrate 370 and a conductive overlay 380.

The conductive substrate 370 is formed as an electrode wherein the secondary layer forms the bulk of the electrode 370b and the primary layer forms a liner 370a for the bulk electrode. The liner 370a, which contacts the CEM layer, is formed from a conductive material, such as platinum, which is substantially resistant to oxidation and a barrier to diffusion or migration of oxygen anion from the CEM layer 360 to the bulk electrode 370b. The bulk electrode 370b is formed from a conductive material, such as titanium nitride, which may form an interfacial layer as described for FIG. 2A were it to contact the CEM layer.

Likewise, the conductive overlay 380 is formed as an electrode wherein the secondary layer forms the bulk of the electrode 380b and the primary layer forms a liner 380a for the bulk electrode. The liner 380a, which contacts the CEM layer, is formed from a conductive material, such as platinum or another noble metal, which is substantially resistant to oxidation and a barrier to diffusion or migration of oxygen anion from the CEM layer 360 to the bulk electrode 380b. The bulk electrode 380b is formed from a conductive material, such as titanium nitride or titanium, which may form an interfacial layer as described for FIG. 2A were it to contact the CEM layer.

Note that the liners 370a and 380a may have similar or different thickness and/or be formed from the same or different conductive materials as compared to each other.

Similarly, the bulk electrodes 370b and 380b may have similar or different thickness and/or be formed from the same or different conductive materials as compared to each other.

Although it is not a particular requirement of the present disclosure, the thickness of each bulk electrode 370b, 380b is typically greater than its liner 370a, 380b.

The thickness and the conductive material of each of the bulk electrodes 370b, 380b may be chosen so that the bulk electrode 370b provides a hard mask and the bulk electrode 380b provides an etch stop for etching the switching device into a (inverted T) configuration of suitable dimensions for integration to a conventional circuit board.

The liners 370a and 380a are relatively conducting (as compared to the CEM layer 360) so that the device does not require the application of a relatively high filament-forming voltage before its switching operation.

Figure 2B:
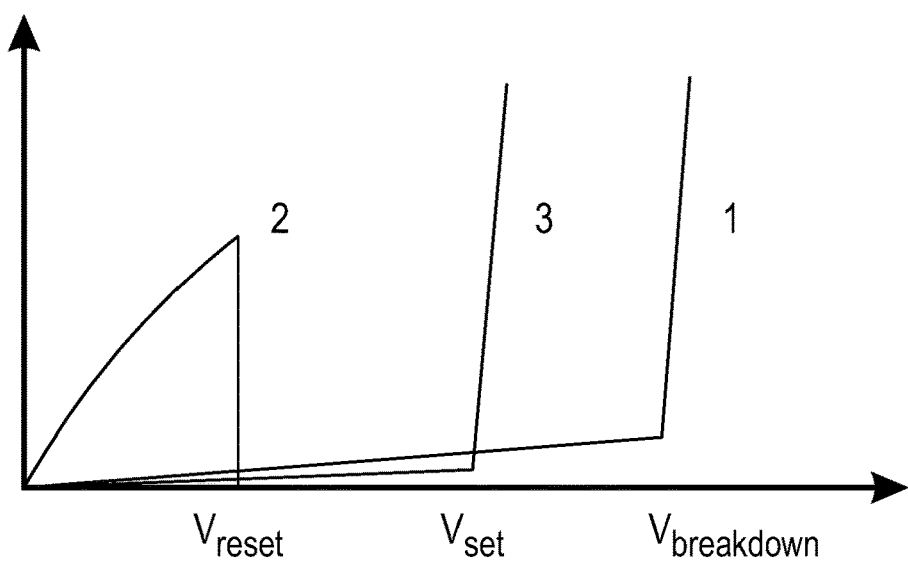
FIG. 2B shows a schematic illustration of part current density versus voltage profile for the CEM switching device of FIG. 2A.
Figure 3B:
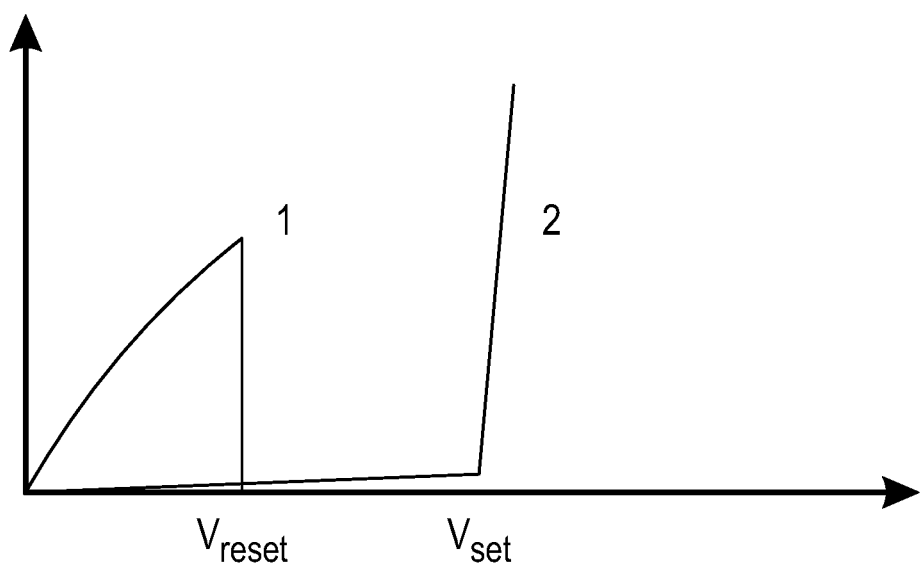
FIG. 3B shows a schematic illustration of a part current density versus voltage profile for the switching device of FIG. 3A.

FIGS. 2B and 3B shows a comparison between the voltages that may be applied to the CEM switching devices of FIG. 2A and FIG. 3A. When the work function of the liners 370a, 380a are well matched to the direction of charge transfer across the CEM switching device, the equivalent circuit may be the same as that shown for the CEM switching device of FIG. 1B, viz., it comprises a parallel combination of a variable resistance 392 with a variable capacitance 394.

Figure 4:
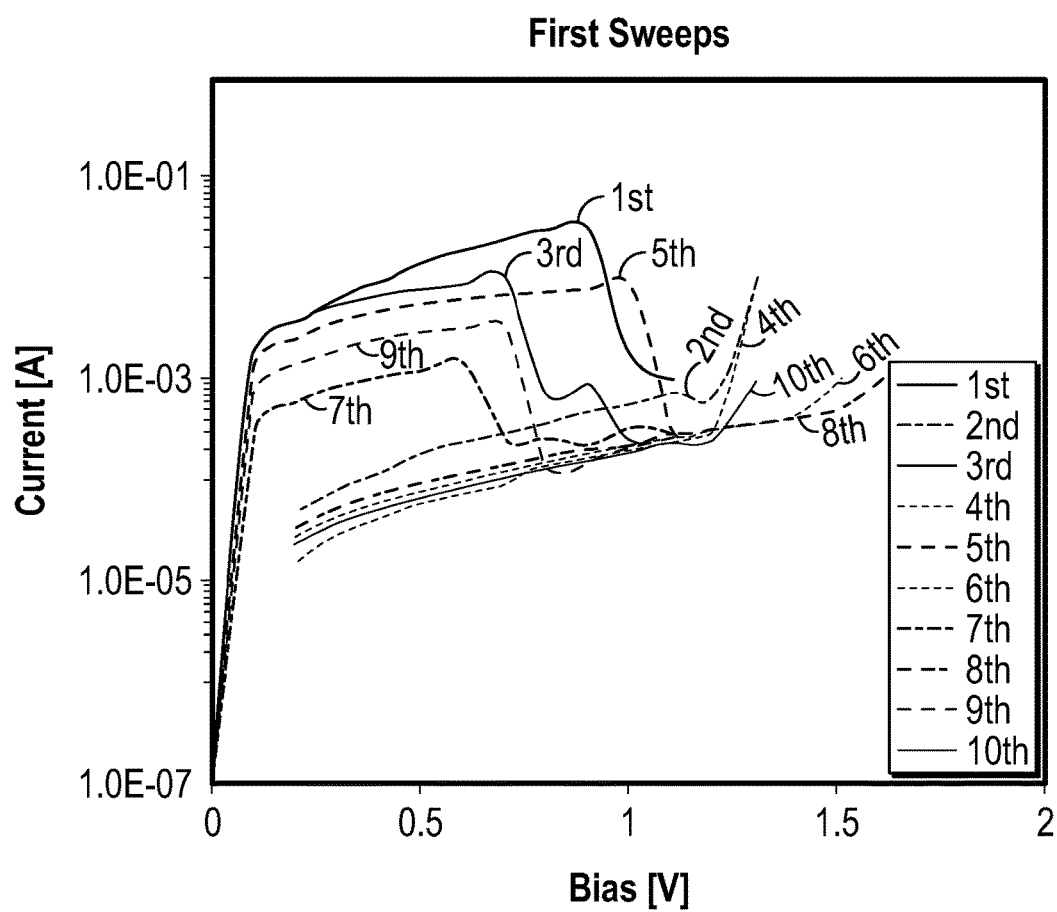
FIG. 4 shows a graph of current density versus voltage for one embodiment of the CEM switching device of the present disclosure.

FIG. 4 shows a plot of current versus voltage over the first ten sweeps for a CEM switching device similar to that described in FIG. 3 (after etching).

In this device, a tungsten-tantalum (W 1000 Å; Ta overlay 30 Å) electrode 370b with platinum (100 Å) liner 370a is provided on a silicon wafer (300 mm p-type silicon) having a thin silica layer (2000 Å). A CEM layer 360 is formed as a layer of doped nickel oxide (~600 Å) on the liner 370a and a platinum electrode (1500 Å) is formed on the CEM layer.

Note that in this device, there is no liner 380a for the bulk electrode 380b because the bulk electrode 380b is itself a noble metal. FIG. 4 shows that, in this device, the CEM layer is "born-on" and that switching to a relatively insulating state occurs at voltages below 2.0V.

Figure 5:
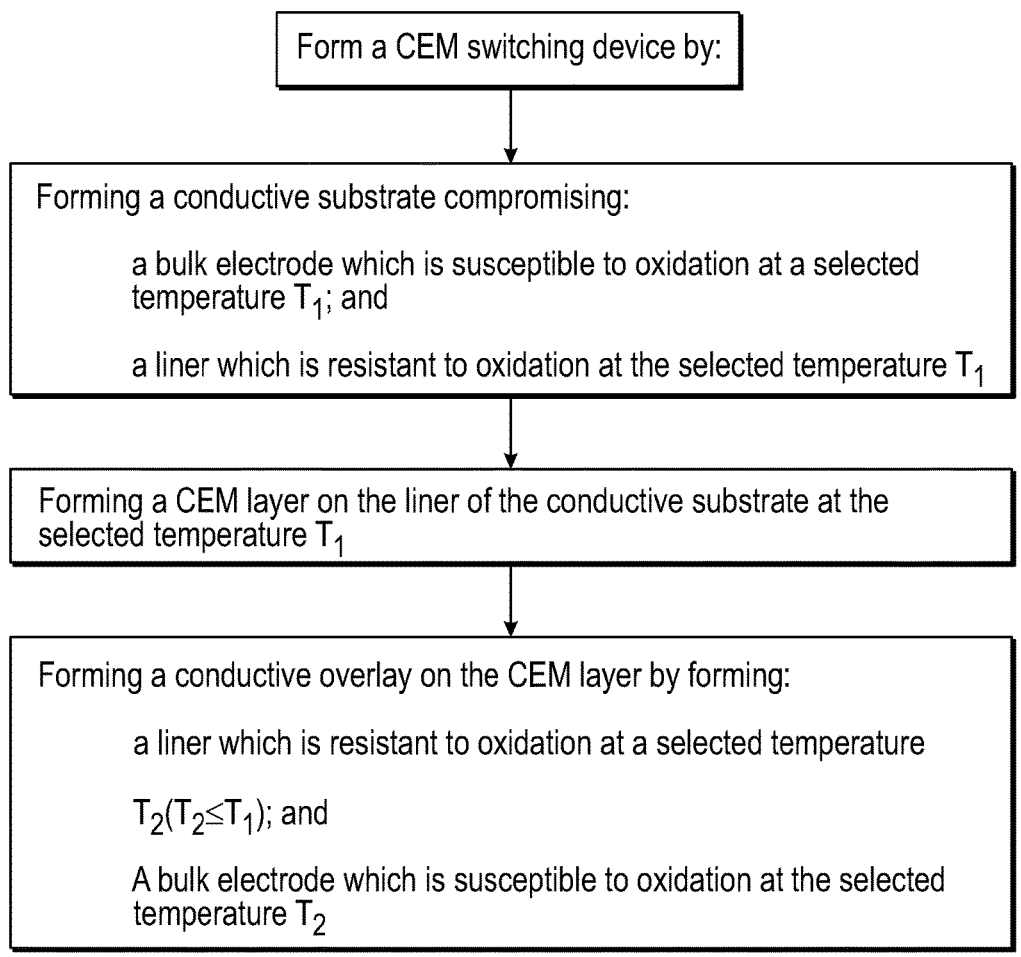
FIG. 5 is a flow chart generally illustrating the manufacture of CEM switching devices according to the present disclosure.

FIG. 5 shows a flow diagram outlining one method for forming a CEM switching device according to the present disclosure.

Referring also to FIG. 3A, the method comprises forming a conductive substrate 370 on or over a silicon substrate (for example) as a bulk electrode 370b of a conductive material susceptible to forming an interfacial layer as described in FIG. 2A and forming a liner 370a on the bulk electrode 370b of a conductive material resistant to forming an interfacial layer as described in FIG. 2A.

The method further comprises forming a CEM layer 360 on the liner 370b of the conductive substrate 370 and subsequently forming a liner 380a on the CEM layer 360 of a conductive material resistant to forming an interfacial layer as described in FIG. 2A and forming a bulk electrode 380b on the liner 380a.

Each of these steps may be carried out by an atomic layer deposition or a metallo-organic chemical vapour deposition utilising one or more of an inorganic or organometallic precursor and an oxidising and/or reducing agent.

Note that the conductive material of the liner 370a is resistant to oxidation during the deposition of the CEM layer (and annealing) as well as during the forming of the liner 380a and the bulk electrode 380b.

In general (given that partial pressures of oxidant are not significant), the conductive material of the liner 370a can be selected on the basis of its temperature resistance to oxidation at atmospheric pressure.

The conductive material of the liner 370a may, therefore, be selected to resist oxidation at the highest temperature of those selected for forming the CEM liner, the liner 380a and the bulk electrode 380b.

Likewise, the conductive material of the liner 380a may be selected to resist oxidation at the highest temperature of the temperatures selected for forming that liner or the bulk electrode 380b.

If the forming of the CEM layer utilizes a temperature $T_1$ and the forming of the liner 380a and the bulk electrode 380b respectively utilizes temperatures $T_2$ and $T_3$ wherein $T_1 > T_2 > T_3$, the conductive material of the liner 370a will be resistant to oxidation at temperatures up to $T_1$ and the conductive material of the liner 380a will be resistant at temperatures up to $T_2$.

Note that it is not particularly important what temperatures are used for forming the bulk electrode 370b and its liner 370a provided that, as mentioned above, the forming of the liner 370a does not lead to oxidation of the bulk electrode 370b.

In other embodiments, the method may form a liner 370a which may produce an interfacial layer similar to that described in FIG. 2A at or below $T_2$—provided that the liner remains relatively conducting as compared to the CEM layer and does not allow the diffusion or migration of oxygen to the bulk electrode 370b.

Likewise, the method may form a liner 380a which may produce an interfacial layer similar to that described in FIG. 2A at or below $T_3$—provided that the liner remains relatively conducting as compared to the CEM layer and does not allow the diffusion or migration of oxygen to the bulk electrode 380b.

Although embodiments of the presently disclosed methods and devices have been described in detail, it should be apparent to those skilled in the art that other embodiments are possible within the scope of the accompanying claims.

Note that a reference in this disclosure to a primary layer that is relatively conducting or relatively conducting as compared to the CEM layer is a reference to a primary layer of similar impedance or resistivity as the CEM layer in its conductive state.

Note also that references describing metal compounds, such as metal oxides, do not necessarily require a particular stoichiometry.

Note further references to ranges, such as temperature ranges, include references to the beginning value as well as the end value.

The invention claimed is:

1. A method for the manufacture of a CEM switching device, which method comprises forming a conductive substrate, forming a layer of a correlated electron material (CEM) on the conductive substrate and forming a conductive overlay on the CEM layer, wherein the forming the conductive overlay comprises forming a primary layer of a conductive material contacting the CEM layer and forming a secondary layer of a conductive material on or over the primary layer and the forming of the conductive substrate comprises forming a secondary layer of a conductive material on a substrate and forming a primary layer of a conductive material on the secondary layer wherein the thickness of the secondary layer is greater than that of the primary layer and wherein the conductive material of the primary layer is substantially resistant to diffusion or migration of oxygen ion from the CEM layer to the secondary layer.

2. The method according to claim 1, wherein the conductive material of the primary layer is substantially resistant to diffusion or migration of oxygen ion at temperatures between 20° C. and 1000° C.

3. The method according to claim 1, wherein the conductive material of the primary layer is substantially resistant to diffusion or migration of oxygen ion at temperatures between 20° C. and 750° C.

4. The method according to claim 1, wherein the conductive material of the primary layer is substantially resistant to diffusion or migration of oxygen ion at temperatures between 20° C. and 450° C.

5. The method according to claim 1, wherein the conductive material of the primary layer is resistant to oxidation by the CEM layer.

6. The method according to claim 1, wherein the CEM layer comprises one or more of a d- or f-block metal oxide.

7. The A method according to claim 1, wherein the conductive material of the secondary layer is susceptible to oxidation by the CEM layer.

8. The method according to claim 7, wherein the conductive material of the secondary layer comprises one or more of copper, cobalt, aluminum, nickel, titanium, tantalum, tungsten, titanium nitride, tantalum nitride, tungsten nitride, a silicide, and polysilicon.

9. The method according to claim 1, wherein the conductive material of the primary layer comprises one or more of a noble metal or a noble metal oxide.

10. A switching device comprising a conductive substrate, a conductive overlay and a layer of a correlated electron material (CEM) therebetween wherein the conductive substrate and the conductive overlay each comprises a primary layer of a conductive material and a secondary layer of a conductive material wherein the thickness of the secondary layer is greater than that of the primary layer and wherein the primary layer contacts the CEM layer and is substantially resistant to diffusion or migration of oxygen ion from the CEM layer to the secondary layer.

11. The switching device according to claim 10, wherein the conductive material of the primary layer comprises one or more of a noble metal or a noble metal oxide.

12. The switching device according to claim 10, wherein the conductive material of the secondary layer is susceptible to oxidation by the CEM layer.

13. The switching device according to claim 11, wherein the one or more noble metal is selected from the group consisting of platinum, palladium, rhodium, ruthenium and iridium.

14. The switching device according to claim 12, wherein the conductive material of the secondary layer comprises one or more of copper, cobalt, aluminum, nickel, titanium, tantalum, tungsten, titanium nitride, tantalum nitride, tungsten nitride, a metal silicide and polysilicon.

* * * * *